US 10,566,382 B2

(12) United States Patent
Yeon et al.

(10) Patent No.: US 10,566,382 B2
(45) Date of Patent: Feb. 18, 2020

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Ji Hye Yeon, Suwon-si (KR); Han Kyu Seong, Seoul (KR); Wan Tae Lim, Suwon-si (KR); Sung Hyun Sim, Uiwang-si (KR); Hanul Yoo, Bucheon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 36 days.

(21) Appl. No.: 15/788,933

(22) Filed: Oct. 20, 2017

(65) Prior Publication Data

US 2018/0286915 A1 Oct. 4, 2018

(30) Foreign Application Priority Data

Mar. 31, 2017 (KR) .................... 10-2017-0041710

(51) Int. Cl.
*H01L 27/15* (2006.01)
*H01L 33/50* (2010.01)
(Continued)

(52) U.S. Cl.
CPC ............ *H01L 27/153* (2013.01); *H01L 33/38* (2013.01); *H01L 33/507* (2013.01); *H01L 33/62* (2013.01);
(Continued)

(58) Field of Classification Search
CPC ... H01L 27/153; H01L 33/0079; H01L 33/22; H01L 33/32; H01L 33/38; H01L 33/44; H01L 33/507; H01L 33/62
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| JP | 2010-118624 A | 5/2010 |
| JP | 2015-38957 A | 2/2015 |

*Primary Examiner* — Joseph M Galvin, III
(74) *Attorney, Agent, or Firm* — Lee IP Law, P.C.

(57) ABSTRACT

A semiconductor light emitting device includes a plurality of light emitting cells including a first conductivity type semiconductor layer, a second conductivity type semiconductor layer, and an active layer between the first and second conductivity type semiconductor layers, an insulating layer on the plurality of light emitting cells and having a first opening and a second opening defining a first contact region of the first conductivity type semiconductor layer and a second contact region of the second conductivity type semiconductor layer, respectively, in each of the plurality of light emitting cells, a connection electrode on the insulating layer and connecting the first contact region and the second contact region to electrically connect the plurality of light emitting cells to each other, a transparent support substrate on the insulating layer and the connection electrode, and a transparent bonding layer between the insulating layer and the transparent support substrate.

20 Claims, 16 Drawing Sheets

(51) Int. Cl.
  H01L 33/62 (2010.01)
  H01L 33/38 (2010.01)
  H01L 33/22 (2010.01)
  H01L 33/00 (2010.01)
  H01L 33/32 (2010.01)

(52) U.S. Cl.
  CPC .......... *H01L 33/0079* (2013.01); *H01L 33/22* (2013.01); *H01L 33/32* (2013.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,324,650 B2 | 12/2012 | Seo et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,643,029 B2 | 2/2014 | Lee et al. |
| 8,648,380 B2 | 2/2014 | Kim et al. |
| 8,735,931 B2 | 5/2014 | Han et al. |
| 8,766,295 B2 | 7/2014 | Kim |
| 9,041,039 B2 | 5/2015 | Emura et al. |
| 9,300,111 B2 | 3/2016 | Lee et al. |
| 9,431,377 B2 | 8/2016 | Seo et al. |
| 2012/0007044 A1* | 1/2012 | Seo ............... H01L 25/0753 257/13 |
| 2013/0015425 A1* | 1/2013 | Lin ............... H01L 33/0079 257/13 |
| 2014/0110729 A1* | 4/2014 | Seo ............... H01L 27/156 257/88 |
| 2014/0225133 A1 | 8/2014 | Hsieh |
| 2016/0026026 A1* | 1/2016 | Kim ............... G02F 1/13737 349/88 |
| 2016/0190409 A1* | 6/2016 | Kuo ............... H01L 33/486 257/98 |

* cited by examiner

SEMICONDUCTOR LIGHT EMITTING DEVICE

CROSS-REFERENCE TO RELATED APPLICATION

Korean Patent Application No. 10-2017-0041710 filed on Mar. 31, 2017, in the Korean Intellectual Property Office, and entitled: "Semiconductor Light Emitting Device," is incorporated by reference herein in its entirety.

BACKGROUND

1. Field

The present disclosure relates to a semiconductor light emitting device.

2. Description of the Related Art

In general, a semiconductor light emitting device is widely used as a light source due to various advantages thereof, e.g., low power consumption, high brightness, and the like. In detail, a semiconductor light emitting device has been advantageously employed not only for display devices but also for various types of lighting devices.

Recently, a semiconductor light emitting device has been implemented in a multi-cell structure for use at a high rated current. For example, the semiconductor light emitting device may have a structure in which a plurality of light emitting diode (LED) chips, i.e., LED cells, electrically connected to a single substrate are provided. Such an electrical connection, e.g., a wire or a metal wiring, may not only be complicated but may also be easily short-circuited.

SUMMARY

According to an example embodiment, a semiconductor light emitting device includes a plurality of light emitting cells having a first conductivity type semiconductor layer, a second conductivity type semiconductor layer and an active layer disposed therebetween, an insulating layer disposed on first surfaces of the plurality of light emitting cells and having a first opening and a second opening defining a first contact region of the first conductivity type semiconductor layer and a second contact region of the second conductivity type semiconductor layer, respectively, in each of the plurality of light emitting cell, a connection electrode disposed on the insulating layer and connecting the first contact region and the second contact region to electrically connect the plurality of light emitting cells to each other, a transparent support substrate disposed on the insulating layer and the connection electrode, and a transparent bonding layer disposed between the insulating layer and the transparent support substrate.

According to an example embodiment, a semiconductor light emitting device includes a semiconductor stack having a first surface and a second surface located opposite each other, including a first conductivity type semiconductor layer, a second conductivity type semiconductor layer and an active layer disposed therebetween, and divided into a plurality of light emitting cells by an isolation region, the first surface and the second surface being provided by the first conductivity type semiconductor layer and the second conductivity type semiconductor layer, respectively, an insulating layer disposed on the second surface of the semiconductor stack and having a first opening and a second opening defining a first contact region of the first conductivity type semiconductor layer and a second contact region of the second conductivity type semiconductor layer, respectively, in each of the plurality of light emitting cell, a connection electrode disposed on the insulating layer and connecting the first contact region and the second contact region to allow the plurality of light emitting cells to be electrically connected to each other, a transparent bonding layer disposed to cover the second surface of the semiconductor stack in which the insulating layer and the connection electrode are disposed, and a transparent support substrate having a first surface bonded to the second surface of the semiconductor stack by the transparent bonding layer and a second surface opposite to the first surface.

According to an example embodiment, a semiconductor light emitting device includes a transparent support substrate having a first end region and a second end region, and a light-emitting region disposed between the first end region and the second end region, a plurality of light emitting cells including a first conductivity type semiconductor layer, a second conductivity type semiconductor layer and an active layer disposed therebetween, and arranged on the light-emitting region such that the second conductivity type semiconductor layer faces the transparent support substrate, the plurality of light emitting cells being spaced apart from each other, an insulating layer formed along one surface of the plurality of light emitting cells disposed in the transparent support substrate, and having a first opening and a second opening defining a first contact region of the first conductivity type semiconductor layer and a second contact region of the second conductivity type semiconductor layer, respectively, in each light emitting cell, a connection electrode disposed on the insulating layer and connecting a first contact region and a second contact region of different light emitting cells adjacent to each other, and having a first pad portion and a second pad portion extended to the first end region and the second end region of the transparent support substrate, a transparent bonding layer disposed between the transparent support substrate and the plurality of light emitting cells, and a wavelength conversion portion surrounding the transparent support substrate to cover the plurality of light emitting cells.

BRIEF DESCRIPTION OF DRAWINGS

Features will become apparent to those of skill in the art by describing in detail exemplary embodiments with reference to the attached drawings, in which.

DETAILED DESCRIPTION

Embodiments will now be described in detail with reference to the accompanying drawings.

Figure 1:
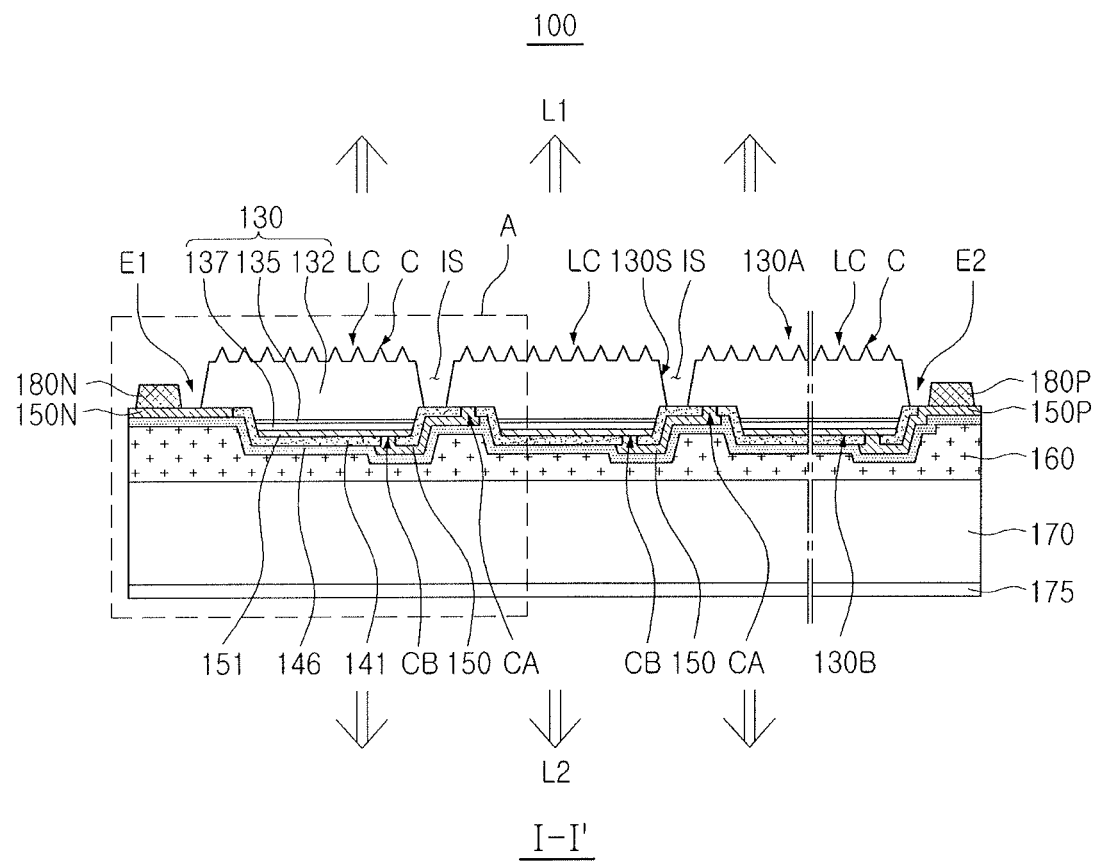
FIG. 1 illustrates a side cross-sectional view of a semiconductor light emitting device according to an example embodiment.
Figure 2:
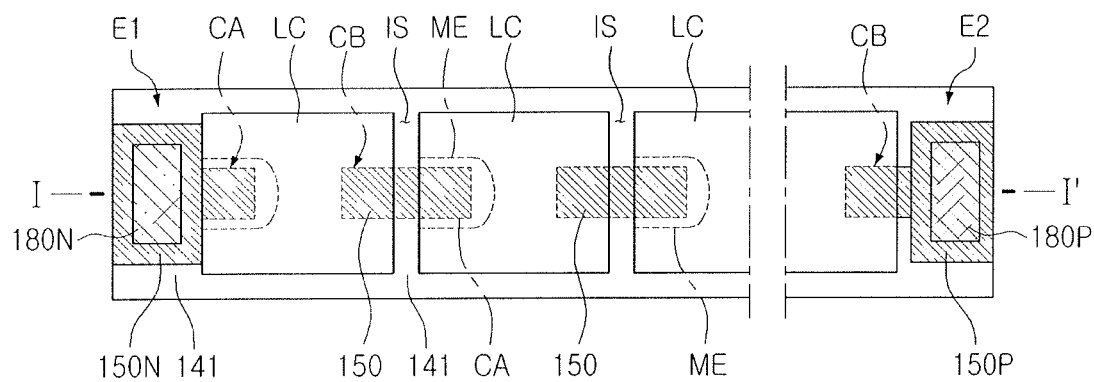
FIG. 2 illustrates a top plan view of the semiconductor light emitting device in FIG. 1.

FIG. 1 is a side cross-sectional view illustrating a semiconductor light emitting device according to an example embodiment, and FIG. 2 is a top plan view illustrating the semiconductor light emitting device illustrated in FIG. 1. It is noted that FIG. 1 is a cross-sectional view along line I-I' of FIG. 2.

With reference to FIGS. 1 and 2, a semiconductor light emitting device 100 according to an example embodiment may include a semiconductor stack 130, a transparent support substrate 170 for supporting the semiconductor stack 130, and a transparent bonding layer 160 for bonding the semiconductor stack 130 to the transparent support substrate 170. The semiconductor light emitting device 100 may be configured to emit light not only in a first direction L1, i.e., an upper direction L1, but also in a second direction L2, i.e., a lower direction L2.

The semiconductor stack 130 may include a first conductivity type semiconductor layer 132 and a second conductivity type semiconductor layer 137, as well as an active layer 135 located therebetween. For example, the first conductivity type semiconductor layer 132 and the second conductivity type semiconductor layer 137, as well as the active layer 135, may be a nitride semiconductor. The first conductivity type semiconductor layer 132 may be provided as a nitride semiconductor satisfying an n-type $Al_xIn_yGa_{1-x-y}N$ ($0 \leq x \leq 1$, $0 \leq y \leq 1$, $0 \leq x+y \leq 1$), and an n-type impurity may be Si. For example, the first conductivity type semiconductor layer 132 may be n-type GaN. The second conductivity type semiconductor layer 137 may be a nitride semiconductor layer satisfying p-type $Al_xIn_yGa_{1-x-y}N$, and a p-type impurity may be Mg. For example, the second conductivity type semiconductor layer 137 may be p-type AlGaN/GaN. The active layer 135 may have a multiple quantum well (MQW) structure in which a quantum well layer and a quantum barrier layer are alternatively stacked. For example. when a nitride semiconductor is used, the active layer 135 may have a GaN/InGaN MQW structure.

The semiconductor stack 130 may have a first surface 130A and a second surface 130B provided by the first conductivity type semiconductor layer 132 and the second conductivity type semiconductor layer 137, respectively. For example, as illustrated in FIG. 1, the first surface 130A may be an upper surface, i.e., a surface facing away from the transparent support substrate 170, of the first conductivity type semiconductor layer 132, and the second surface 130B may be a lower surface, i.e., a surface facing the transparent support substrate 170, of the second conductivity type semiconductor layer 137.

A concave-convex portion C for improving light extraction efficiency may be formed in the first surface 130A of the semiconductor stack 130. In an example embodiment, the concave-convex portion C may be a protruding portion, e.g., a hexagonal pyramid, in which a cross section is triangular, but may have various shapes, as required. The concave-convex portion C may be formed by processing a surface of the first conductivity type semiconductor layer 132. Unlike an example embodiment, a buffer layer used for growing the semiconductor stack 130 remains, and thus may form at least a portion of the concave-convex portion C.

As illustrated in FIGS. 1 and 2, the semiconductor stack 130 may be divided into a plurality of light emitting cells LC by an isolation region IS. In an example embodiment, the isolation region IS may be formed not only in a region disposed between the light emitting cells LC but also along a circumference of the light emitting cell LC, e.g., the isolation region IS may surround a perimeter of each of the light emitting cells LC as seen in plan view. A side surface 130S of the light emitting cell LC having been divided may be a surface inclined upwards. In other words, as illustrated in FIG. 1, the isolation region IS may become narrower from the first surface 130A toward the second surface 130B. A shape described above may be related to an etching process for forming the isolation region IS (referring to FIGS. 13 and 14).

In an example embodiment, a form in which the plurality of light emitting cells LC are arranged in a single row is illustrated, but an example embodiment is not limited thereto. The plurality of light emitting cells may be arranged in a plurality of rows or may have a variety of other arrangements.

In each light emitting cell LC, not only a region of the second conductivity type semiconductor layer 137, but also a region of the first conductivity type semiconductor layer 132, may be exposed toward the second surface 130B. As illustrated in FIG. 1, regions ME of the second conductivity type semiconductor layer 137 and the active layer 135 are mesa etched, so a region ME of the first conductivity type semiconductor layer 132 may be exposed, as will be described in more detail below with reference to FIG. 3.

On the second surface 130B of the semiconductor stack 130, a wiring structure for electrically connecting the plurality of light emitting cells LC may be provided. The wiring structure applied to an example embodiment may include an insulating layer 141 formed along the second surface 130B of the semiconductor stack 130, and a connection electrode 150 for connecting a first contact region CA and a second contact region CB of the plurality of light emitting cells LC.

In detail, as illustrated in FIG. 1, the insulating layer 141, applied to an example embodiment, may have a first portion located on the second surface 130B of the light emitting cell LC and a second portion located between the light emitting cells LC. For example, as illustrated in FIG. 1, the first portion of the insulating layer 141 may extend along a part of the bottom of the light emitting cell LC, i.e., between the second surface 130B and the transparent support substrate 170 and overlapping the second surface 130B, and the second portion of the insulating layer 141 may extend between bottoms of adjacent light emitting cells LC. The second portion of the insulating layer 141, located between the light emitting cells LC, may be provided as a bottom surface of the isolation region IS. The connection electrode 150 may be positioned between the insulating layer 141 and the transparent support substrate 170, so opposite edges of the connection electrode 150 may be electrically connected through the insulating layer 141 to the first and second contact regions CA and CB of the adjacent light emitting cells LC, respectively, as will be described in more detail below with reference to FIG. 3.

Figure 3:
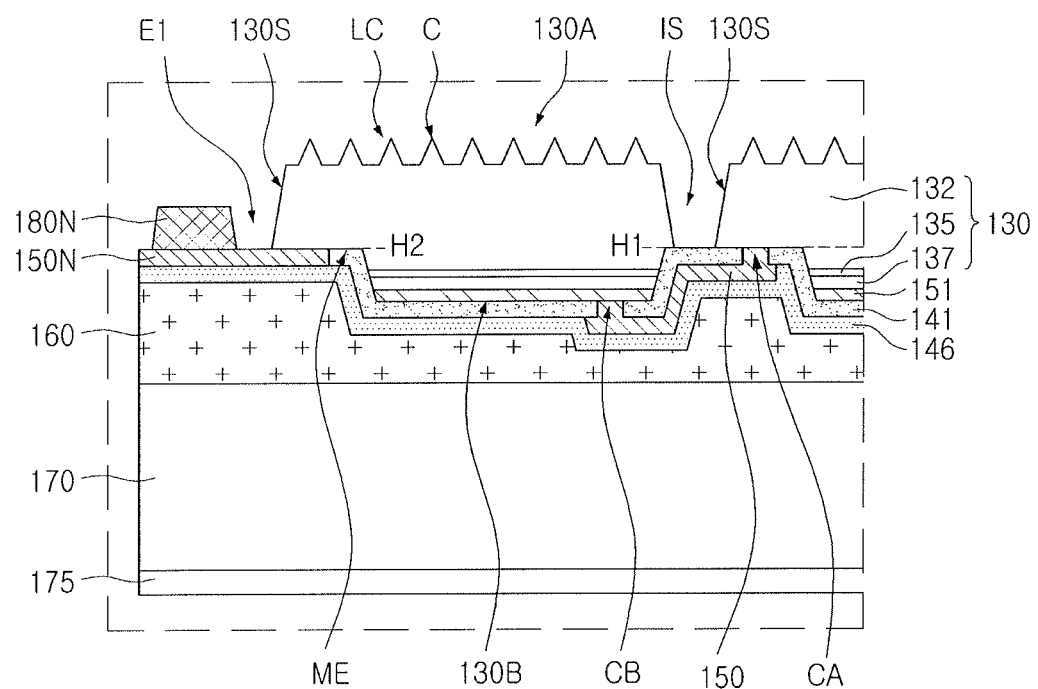
FIG. 3 illustrates a partially enlarged view of portion A of the semiconductor light emitting device illustrated in FIG. 1.

FIG. 3 illustrates an enlarged portion A of the semiconductor light emitting device 100.

For example, with reference to FIGS. 1 and 3, the first and second portions of the insulating layer 141 may be arranged alternately on the transparent support substrate 170, so the second portion of the insulating layer 141 may extend, e.g., directly, on parts of lower surfaces of adjacent first conductivity type semiconductor layers 132 to connect between adjacent light emitting cells LC, and the first portion of the insulating layer 141 may extend between second portions of the insulating layer 141 on parts of lower surfaces of second conductivity type semiconductor layers 137. As such, referring to FIG. 1, a distance between the first portion of the insulating layer 141 and the transparent support substrate 170 may be smaller than a distance between the second portion of the insulating layer 141 and the transparent support substrate 170. Further, referring to FIG. 3, a level H1 of the second portion of the insulating layer 141, i.e., the portion located in the isolation region IS, may be substantially the same as a level H2 of a portion of the insulating layer 141 mesa etched.

As further illustrated in FIG. 3, the insulating layer 141 may include openings therethrough exposing the first conductivity type semiconductor layer 132 and the second conductivity type semiconductor layer 137 of adjacent light emitting cells LC, respectively. For example, a first opening O1 and a second opening O2 (FIG. 8) may be formed through the insulating layer 141 in regions corresponding to adjacent light emitting cells LC (FIG. 3), respectively, so a portion of a mesa etched region ME of the first conductivity type semiconductor layer 132 and the second conductivity type semiconductor layer 137 may be exposed. Exposed regions of the first conductivity type semiconductor layer 132 and the second conductivity type semiconductor layer 137 may be provided as the first contact region CA and the second contact region CB. In other words, the first opening O1 and the second opening O2 through the insulating layer 141 may define the second contact region CB and the first contact region CA, respectively.

The insulating layer 141 may be formed of, e.g., SiO$_2$, Si$_3$N$_4$, HfO$_2$, SiON, TiO$_2$, Ta$_2$O$_5$, or SnO$_2$.

In an example embodiment, an ohmic contact layer 151 may be further formed on the lower surface of the second conductivity type semiconductor layer 137, e.g., the ohmic contact layer 151 may be formed between the lower surface of the second conductivity type semiconductor layer 137 and the insulating layer 141. In this case, the second contact region CB may be provided as an exposed region of the ohmic contact layer 151. For example, the ohmic contact layer 151 may include a transparent conductive material, e.g., indium tin oxide (ITO). In the case of ITO, the ohmic contact layer 151 may have a current spreading function.

With reference to FIGS. 1 and 3, the connection electrode 150 may be formed along the insulating layer 141 to connect the first contact region CA and the second contact region CB of the plurality of light emitting cells LC. In an example embodiment, as illustrated in FIG. 2, the connection electrode 150 may be configured to connect different regions, the first contact region CA and the second contact region CB, of the light emitting cells LC adjacent to each other so as to drive the plurality of light emitting cells LC in series. For example, the connection electrode 150 may include, e.g., silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure formed of a single layer or two or more layers. In an example embodiment, the connection electrode 150 may include Ag or Ag/Ni.

In an example embodiment, additionally, a passivation film 146 may be disposed on the insulating layer 141 to cover, e.g., the bottom of, the connection electrode 150, e.g., the connection electrode 150 may be between the passivation film 146 and the insulating layer 141. The connection electrode 150, e.g., a metal, may have a problem in which bonding strength to the transparent bonding layer 160 is low. Therefore, according to embodiments, the passivation film 146 may be selectively introduced between the connection electrode 150 and the transparent bonding layer 160 to improve bonding strength. Thus, if sufficient bonding strength exists between the connection electrode 150 and the transparent bonding layer 160, the passivation film 146 may be omitted. The passivation film 146 may be formed of a material similar to that of the insulating layer 141, e.g., SiO$_2$, Si$_3$N$_4$, HfO$_2$, SiON, TiO$_2$, Ta$_2$O$_5$, or SnO$_2$.

The transparent support substrate 170 may be disposed on the second surface 130B of the semiconductor stack 130, e.g., the transparent bonding layer 160 may be between the transparent support substrate 170 and the second surface 130B of the semiconductor stack 130. The transparent support substrate 170 may be replaced with a growth substrate used for growing the semiconductor stack 130, as a supporting substrate. The transparent support substrate 170 may be bonded to the second surface 130B of the semiconductor stack 130 in which a wiring structure is formed using the transparent bonding layer 160.

The transparent support substrate 170 may be properly formed of a material capable of transmitting light generated in the active layer 135. For example, the transparent support substrate 170 is not particularly limited, but may be a sapphire substrate or a glass substrate. The transparent bonding layer 160 may be formed of a spin-on-glass, in addition to an adhesive polymer material. For example, the adhesive polymer may include a silicone resin, an epoxy resin, polyacrylate, polyimide, polyamide, or benzocyclobutene (BCB).

As illustrated in FIGS. 1 and 3, the transparent support substrate 170 may include a refractive index matching layer 175 disposed on a surface opposite to a surface opposing the second surface 130B of the plurality of light emitting cells LC, i.e., the light emitting cells LC and the refractive index matching layer 175 may be on opposite surfaces of the transparent support substrate 170. The refractive index matching layer 175 may be a layer introduced to more efficiently emit light in the second direction L2 from the transparent support substrate 170, and may be formed of a material having a refractive index lower than a refractive index of the transparent support substrate 170.

Referring to FIG. 1, in an example embodiment, the transparent support substrate 170 may have a first end region E1 and a second end region E2, in which a light emitting cell LC is not disposed. The first and second end regions E1 and E2 may be on opposite edges of region in which a light emitting cell LC is disposed (or referred to as a 'light-emitting region').

As illustrated in FIGS. 1 and 2, the connection electrode 150 may have a first pad portion 150N, i.e., a first pad connection electrode 150N, extended to the first end region E1, and a second pad portion 150P, i.e., a second pad connection electrode 150P, extended to the second end region E2. A first bonding pad 180N and a second bonding pad 180P may be formed in the first pad portion 150N and the second pad portion 150P, respectively. A voltage is applied to the first bonding pad 180N and the second bonding pad 180P, so light emitting cells LC connected in series may be driven. The first pad portion 150N and the second pad portion 150P may be located on substantially the same level as the level H1 of the insulating layer 141 located in a bottom surface of the isolation region IS by which the plurality of light emitting cells LC are spaced apart from each other.

As described above, in an example embodiment, while the first surface 130A of the semiconductor stack 130 is provided as a main light emitting surface, a light transmitting structure, e.g., the transparent support substrate 170 and the transparent bonding layer 160, is provided on the second surface 130B, i.e., an opposite surface relative to the first surface 130A, so light may be emitted not only in the first direction L1 but also in the second direction L2. The semiconductor light emitting device 100, in which light is emitted from both, e.g., opposite, surfaces or from an entire surface, e.g., a single surface completely surrounding a perimeter of a semiconductor stack, may be advantageously applied to various lighting devices, and the like (referring to FIGS. 23, 25A, and 25B).

In an example embodiment described above, an arrangement in which a central region of one side of a light emitting cell is mesa etched to connect cells to each other in series is illustrated, but embodiments are not limited thereto. For example, a semiconductor light emitting device may have a variety of different connection structures and arrangements, as will be described in more detail below with reference to FIGS. 4, 5A, and 5B.

Figure 4:
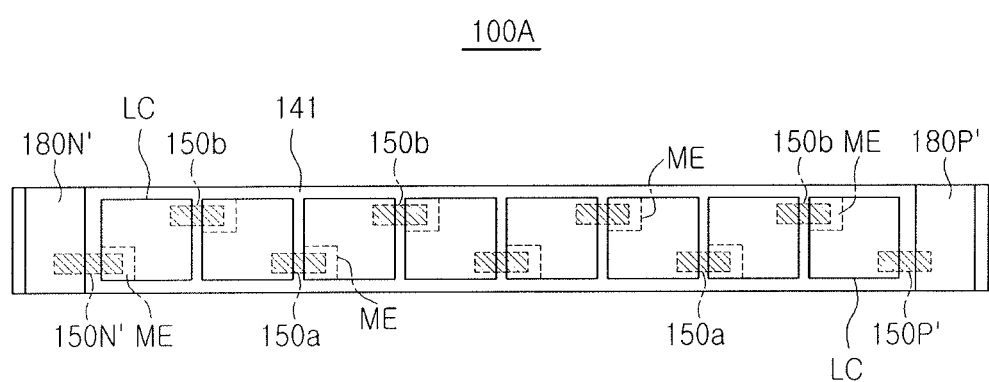
FIGS. 4, 5A, and 5B illustrate top plan views of a semiconductor light emitting device according to various example embodiments.
Figure 5A:
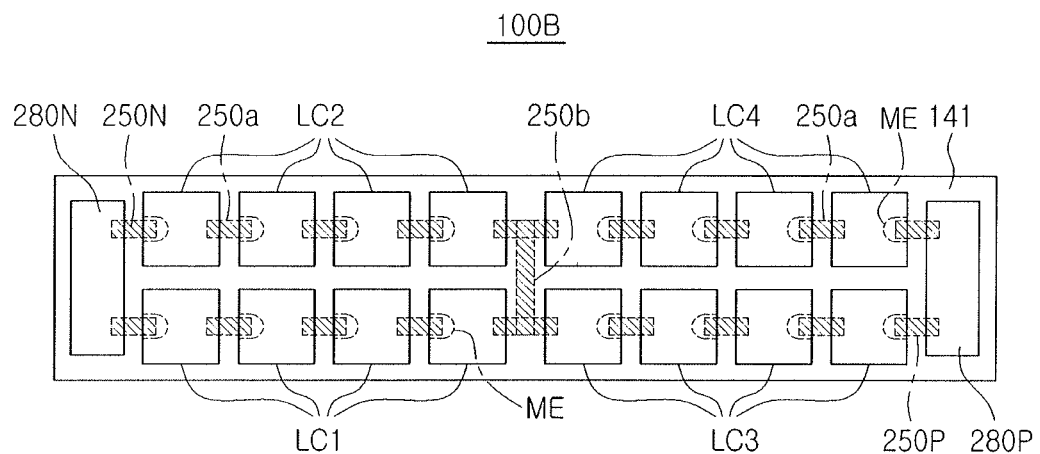
Figure 5B:
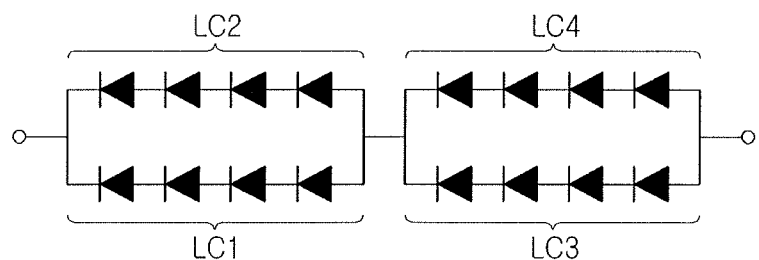

FIGS. 4, 5A, and 5B are top plan views illustrating a semiconductor light emitting device according to various example embodiments, respectively.

With reference to FIG. 4, a semiconductor light emitting device 100A according to an example embodiment may be understood as being similar to the example embodiments described with reference to FIGS. 1 through 3, except that a first connection electrode 150a and a second connection electrode 150b allow corners of a plurality of light emitting cells LC to be connected to each other, and except for a bonding pad configuration.

In detail, in each of the plurality of light emitting cells LC, a single corner has a mesa etched region ME, and mesa etched regions ME may be arranged in a zigzag form in an arrangement direction of the light emitting cells LC. In this arrangement, the first connection electrode 150a and the second connection electrode 150b may be arranged in a zigzag form to be adjacent to both sides opposing each other, respectively. In this arrangement, in a single light emitting cell LC, a current flow is formed in a diagonal direction, so more uniform light emission may be promoted over an entire area.

In addition, regarding a pad configuration, a first pad connection electrode 150N' and a second pad connection electrode 150P' may be located at opposite ends of the semiconductor light emitting device 100A. The first and second pad connection electrodes 150N' and 150P' may be formed in the same pattern as the first connection electrode 150a and the second connection electrode 150b, respectively, and a first bonding pad 180N' and a second bonding pad 180P' can be formed on the first pad connection electrode 150N' and the second pad connection electrode 150P', respectively, to secure a sufficient contact area.

With reference to FIGS. 5A and 5B, a semiconductor light emitting device 100B according to an example embodiment may be understood as being similar to the example embodiments described with reference to FIGS. 1 through 4, except that light emitting cells LC1, LC2, LC3, and LC4 are connected in series or in parallel, and a first connection electrode 250a and a second connection electrode 250b configured for connection of the light emitting cells are included.

In detail, respective light emitting cells LC1, LC2, LC3, and LC4 of a first group through a fourth group include four light emitting cells connected in series, and each of the light emitting cells LC1, LC2, LC3, and LC4 of each group may have a first connection electrode 250a of a similar type to preceding example embodiments (FIGS. 1 through 3). A first connection electrode 250a between the light emitting cells LC1 and LC3 of the first group and the third group, and a first connection electrode 250a between the light emitting cells LC2 and LC4 of the second group and the fourth group may form a desired parallel connection between groups by connecting a second connection electrode 250b therebetween. In detail, like an equivalent circuit illustrated in FIG. 5B, the light emitting cells LC1 and LC2 of the first group and the second group may be connected in parallel. Similarly, the light emitting cells LC3 and LC4 of the third group and the fourth group may be connected in parallel. In addition, regarding a pad configuration, each of a first pad connection electrode 250N and a second pad connection electrode 250P located at opposite ends are provided as two electrodes, and the two electrodes may be connected to a single bonding pad, a first bonding pad 280N, and a second bonding pad 280P.

FIGS. 6 through 14 are cross-sectional views of stages in a method of manufacturing the semiconductor light emitting device illustrated in FIG. 1, and FIGS. 15 through 18 are plan views corresponding to FIGS. 7, 8, 9, and 13, respectively.

Figure 6:
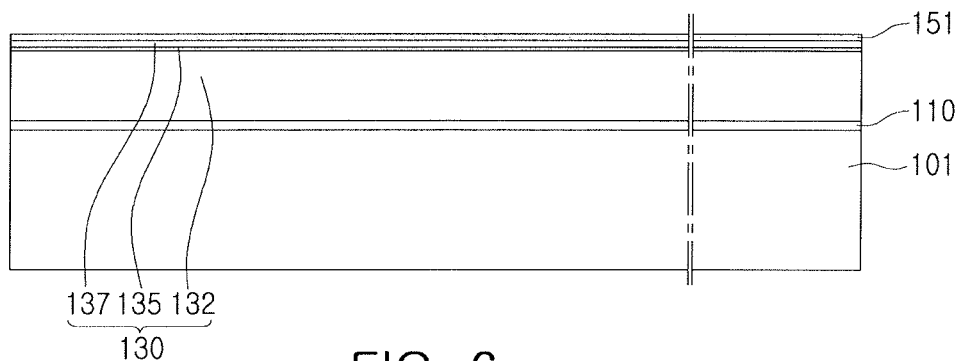
FIGS. 6 through 14 illustrate cross-sectional views of stages in a method of manufacturing the semiconductor light emitting device illustrated in FIG. 1.

With reference to FIG. 6, a buffer layer 110 may be formed on a growth substrate 101, and a semiconductor stack 130 for a plurality of light emitting cells is formed on the buffer layer 110. The semiconductor stack 130 may include a first conductivity type semiconductor layer 132, an active layer 135, and a second conductivity type semiconductor layer 137.

The buffer layer 110 may be $In_xAl_yGa_{1-x-y}N$ ($0 \le x \le 1$, $0 \le y \le 1$). For example, the buffer layer 110 may be formed of AlN, AlGaN, and/or InGaN. As needed, the buffer layer 110 may be used as a plurality of layers that are combined or where a composition is gradually changed. When a growth substrate is a silicon (Si) substrate and allows a nitride semiconductor to grow as the semiconductor stack 130, the buffer layer 110 may have a complex buffer structure having various forms, which will be described with reference to FIGS. 19A through 19D.

Each layer of the semiconductor stack 130 may be a nitride semiconductor illustrated in a preceding example embodiment, and may grow on the growth substrate 101 in a process such as a metalorganic chemical vapor deposition (MOCVD), molecular beam epitaxy (MBE), or hydride vapor phase epitaxial (HVPE). The ohmic contact layer 151 may be further formed on the second conductivity type semiconductor layer 137. For example, the ohmic contact layer 151 may be ITO.

Figure 7:
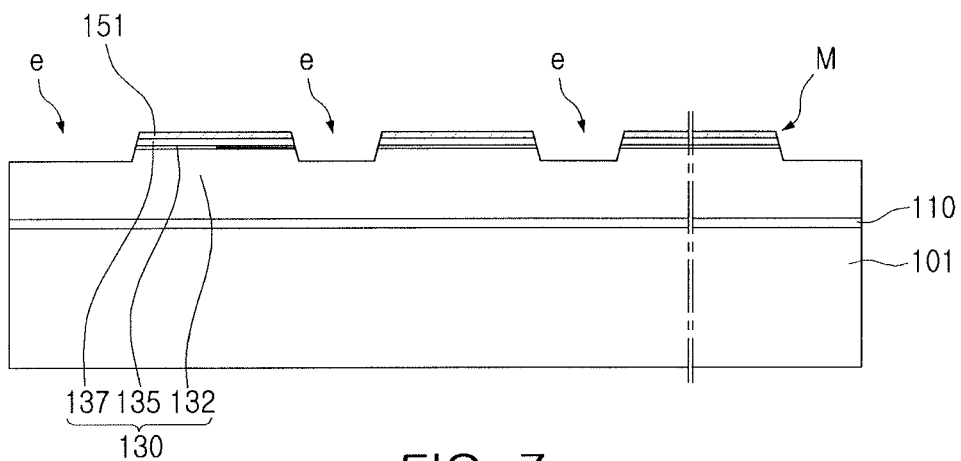
Figure 15:
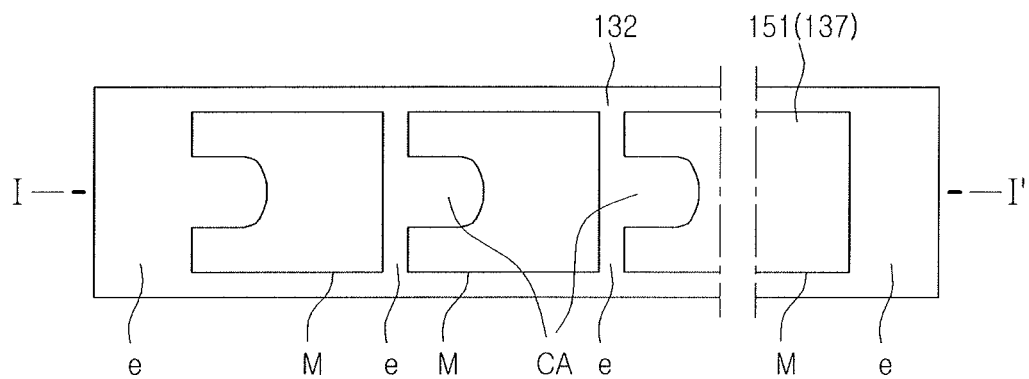
FIGS. 15 through 18 illustrate plan views of stages in a method of manufacturing the semiconductor light emitting device illustrated in FIG. 1.

Next, with reference to FIGS. 7 and 15, in the semiconductor stack 130, a region e of the first conductivity type semiconductor layer 132 may be exposed. That is, an etching process may be performed to remove portions of the second conductivity type semiconductor layer 137 and the active layer 135 in order to expose the first conductivity type semiconductor layer 132 in region e. As illustrated in FIG. 15, at least one mesa structure M, which includes remaining portions of the second conductivity type semiconductor layer 137 with the active layer 135, may be provided, with the region e, i.e., the exposed first conductivity type semiconductor layer 132, surrounding the mesa structure M. As illustrated in FIG. 7, a plurality of mesa structures M, e.g., completely separated from each other, may extend above the region e. Due to the mesa structure M, a region for a light emitting cell may be defined.

A plane of the mesa structure M may have a substantially rectangular shape. A planar shape of the mesa structure M is not limited thereto, and may be various other shapes. The mesa structure M may include a region further etched inwardly from the center of one side of the mesa structure M to provide a contact region, i.e., the first contact region CA of FIG. 16. The region further etched for a contact region is not limited thereto, and may have a line shape or a hole structure located inside the mesa region M. In an example embodiment, the region e, having been exposed, of the first conductivity type semiconductor layer 132 may include regions for forming a pad at both ends, in addition to a region surrounding the mesa structure M for a light emitting cell.

Figure 8:
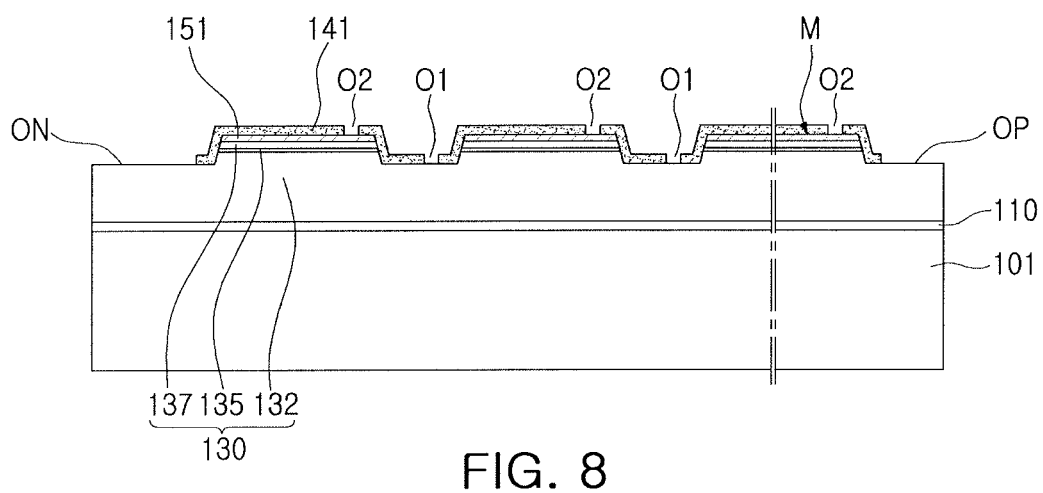
Figure 16:
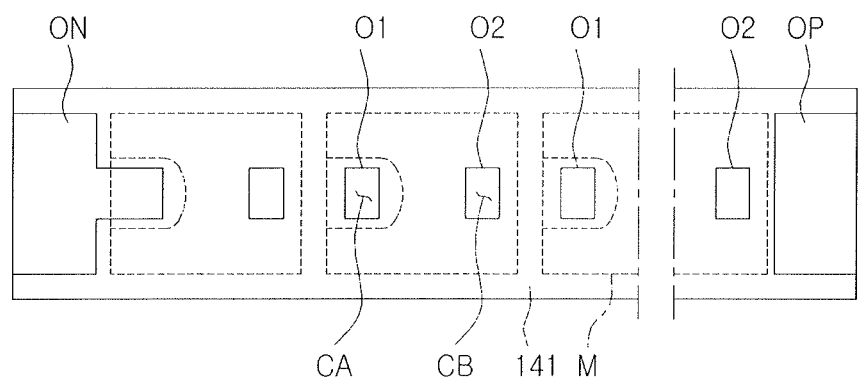

Next, with reference to FIGS. 8 and 16, the insulating layer 141 may be formed on the structure of FIG. 7, e.g., the insulating layer 141 may be confromally formed on the mesa structures M and the region e, followed by forming the first opening O1 and the second opening O2 through the insulating layer 141. The first and second openings O1 and O2 may be formed to exposed portions of the semiconductor stack 130.

In detail, the insulating layer 141 may be formed on the entirety of an upper surface of the semiconductor stack 130, and the first opening O1 and the second opening O2 may be formed using a mask. The first opening O1 and the second opening O2 may define the first contact region CA and the second contact region CB. For example, the insulating layer 141 may be formed of $SiO_2$, $Si_3N_4$, $HfO_2$, SiON, $TiO_2$, $Ta_2O_3$, or $SnO_2$.

Additionally, as further illustrated in FIGS. 8 and 16, an opening for a first pad ON and an opening for a second pad OP may be formed at opposite, e.g., both, ends of the semiconductor stack 130. For example, the opening for the first pad ON and the opening for the second pad OP may be formed by removing the insulating layer 141 to expose opposite edges of the semiconductor stack 130.

Figure 9:
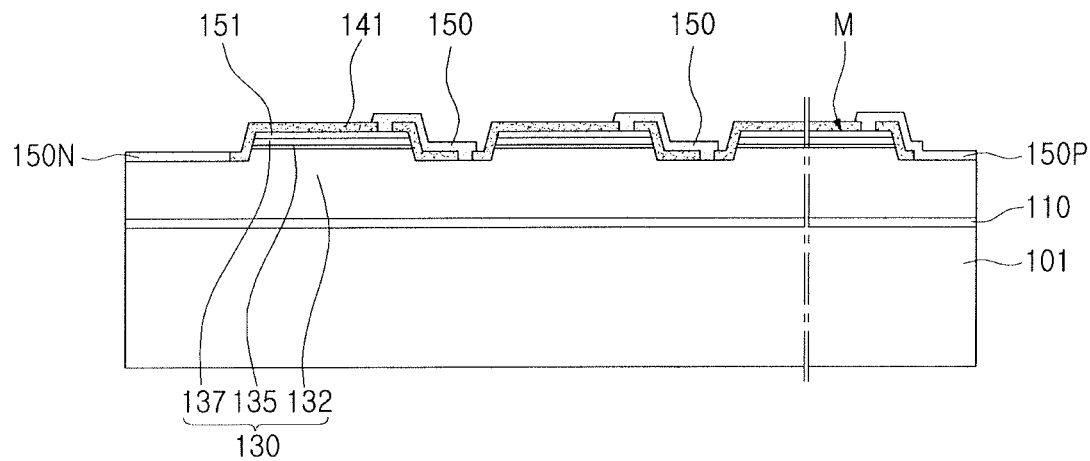
Figure 17:
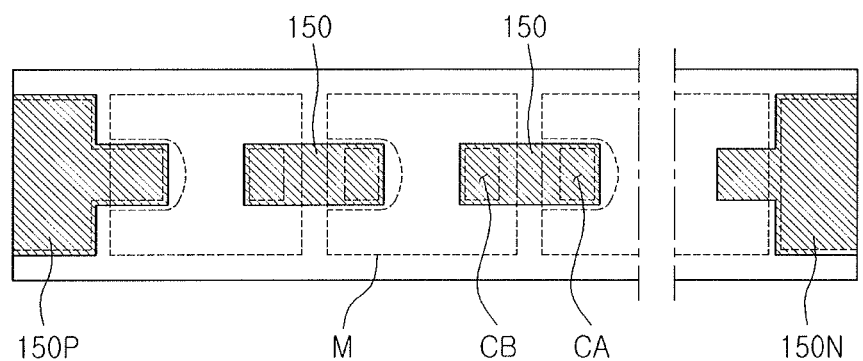

Next, with reference to FIGS. 9 and 17, the connection electrode 150 for connecting the first contact region CA and the second contact region CB of the plurality of light emitting cells LC may be formed. The connection electrode 150 is formed along the insulating layer 141, and thus may prevent an undesired connection with the semiconductor stack 130. In a process illustrated in FIGS. 9 and 17, the connection electrode 150 may connect other contact regions, the first contact region CA and the second contact region CB, of the light emitting cells LC adjacent to each other to allow the plurality of light emitting cells LC to be driven in series. For example, the connection electrode 150 may include Ag, Ni, Al, Rh, Pd, Ir, Ru, Mg, Zn, Pt, or Au.

In addition to the connection electrode 150, the first pad connection electrode 150N and the second pad connection electrode 150P may be formed at both ends, i.e., the first end region E1 and the second end region E2 of the semiconductor stack 130. That is, the first and second pad connection electrodes 150N and 150P may be formed in the respective openings for the first pad ON and the second pad OP of FIGS. 8 and 16. The first pad connection electrode 150N and the second pad connection electrode 150P may provide regions in which bonding pads are to be formed.

Figure 10:
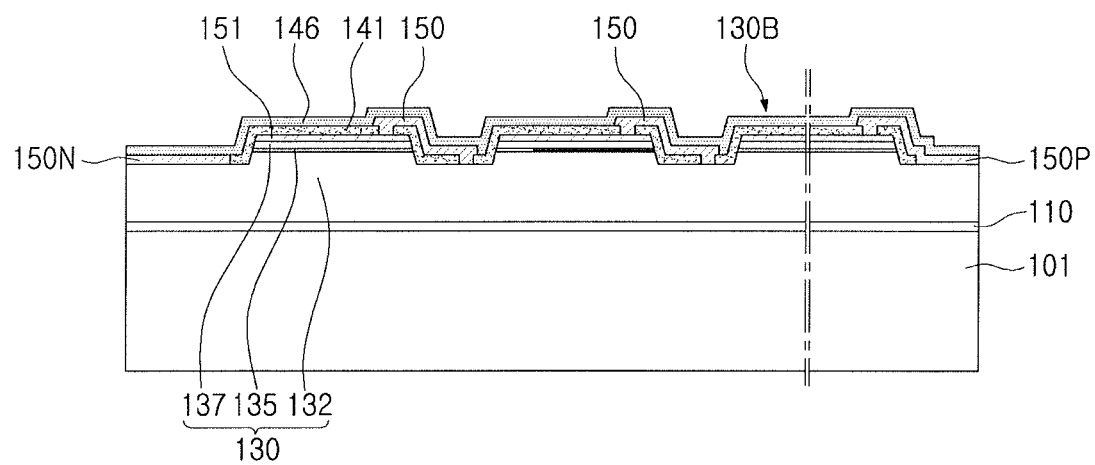

Next, with reference to FIG. 10, the passivation film 146 may be formed on the insulating layer 141 to cover the connection electrode 150. As discussed previously, the passivation film 146 is introduced to enhance bonding strength to the transparent bonding layer 160 to be formed later. The passivation film 146 may be similar to the insulating layer 141, and may be formed in a deposition process. For example, the passivation film 146 may be formed of $SiO_2$, $Si_3N_4$, $HfO_2$, SiON, $TiO_2$. $Ta_2O_3$, or $SnO_2$.

Figure 11:
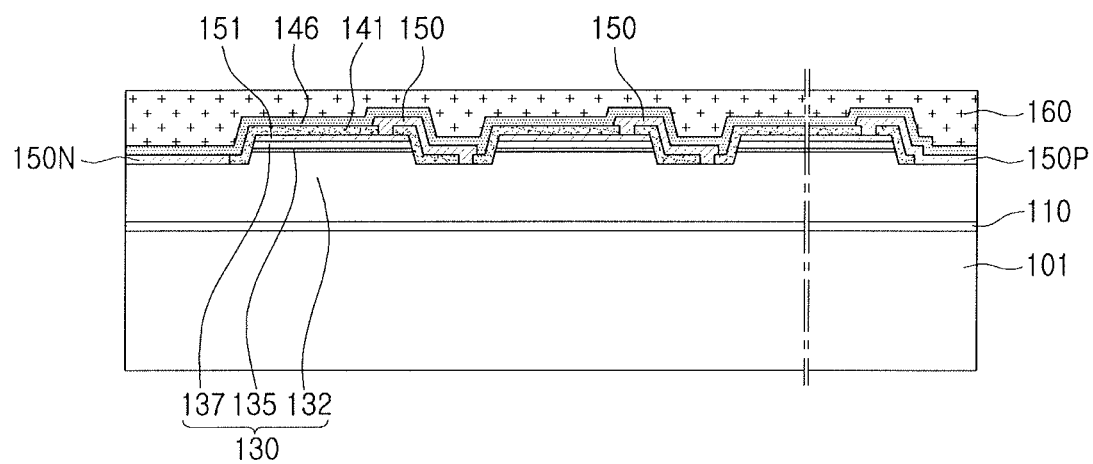

Next, with reference to FIG. 11, the second surface 130B of the semiconductor stack 130 may be coated with the transparent bonding layer 160. When a bonding surface of the transparent support substrate (170 of FIG. 12) to be used in a subsequent process is substantially planar, the transparent bonding layer 160 may be applied to cover the mesa structure M of the semiconductor stack 130. The transparent bonding layer 160 may include, e.g., silicone resin, epoxy resin, polyacrylate, polyimide, polyamide, or benzocyclobutene. In addition to a polymer described above, e.g., a spin-on-glass, is used to bond the transparent support substrate 170. Additionally, the transparent bonding layer 160 may include a material having a refractive index between that of the transparent support substrate 170 and that of the semiconductor stack 130 for a refractive index matching effect for improving light extraction efficiency.

Figure 12:
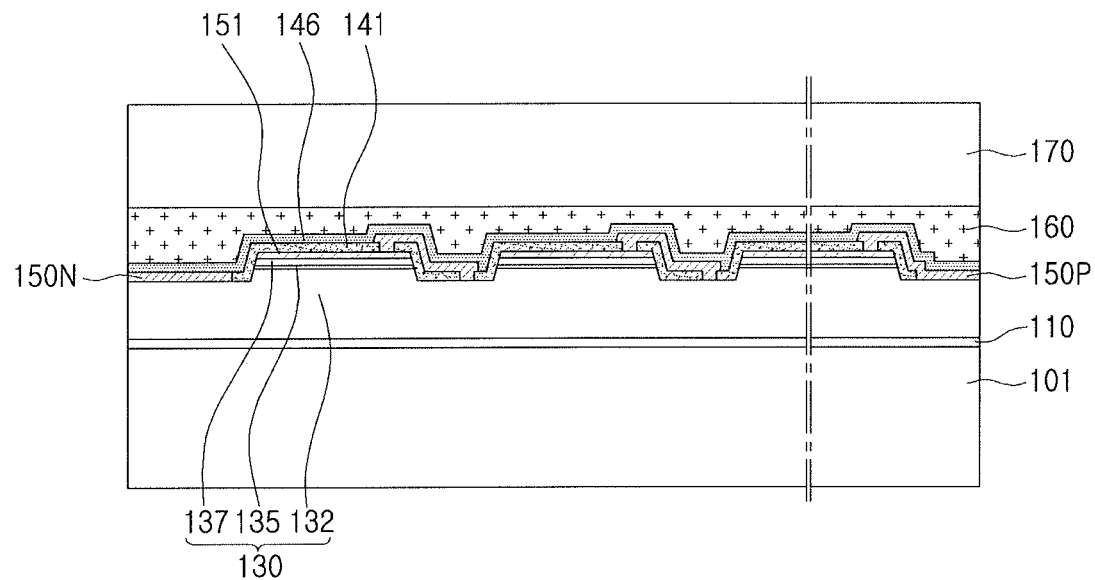

Next, with reference to FIG. 12, the transparent bonding layer 160 is used to bond the transparent support substrate 170 to the second surface 130B of the semiconductor stack 130. The transparent support substrate 170 may be properly formed of a material capable of transmitting light generated in the active layer 135. For example, the transparent support substrate 170 is not particularly limited, but may be a sapphire substrate or a glass substrate. As required, to reduce a thickness of the transparent support substrate 170 to a desired thickness, a grinding process may be performed. In a specific example embodiment, at least one of the transparent bonding layer 160 and the transparent support substrate 170 may be provided as a wavelength conversion portion by containing a wavelength conversion material for converting a wavelength of emitted light.

Figure 13:
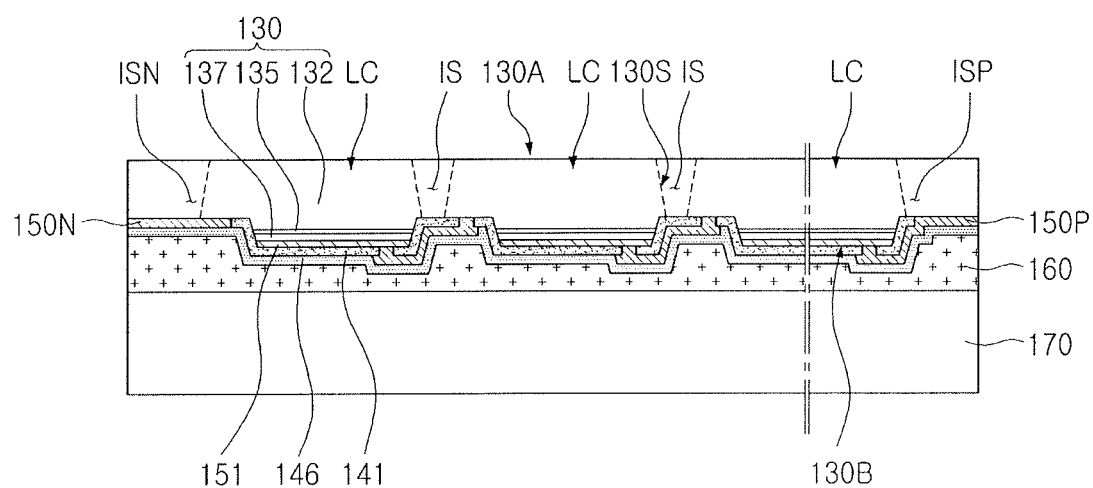
Figure 18:
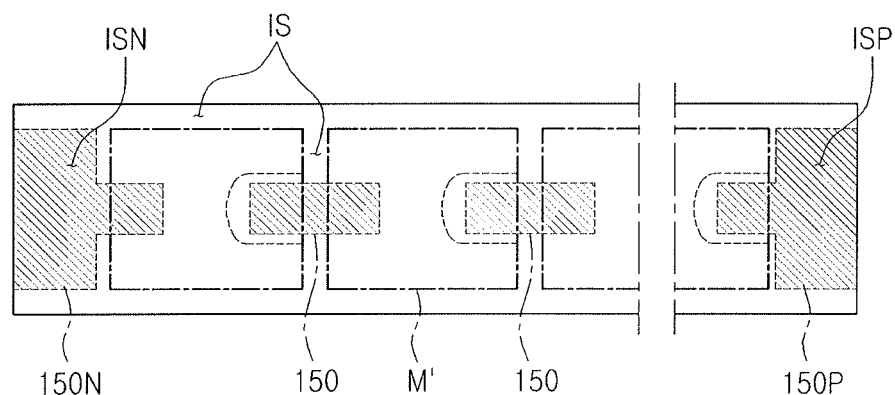

Next, with reference to FIGS. 13 and 18, the growth substrate 101 may be removed from the first surface 130A of the semiconductor stack 130. Here, FIG. 13 may be understood as a cross section in which cross sections of FIGS. 6 through 12 are inverted.

Removal of the growth substrate 101 may be performed by various processes, e.g., laser lift off, mechanical polishing, chemical mechanical polishing, or chemical etching. When a silicon substrate is used as the growth substrate 101, mechanical strength is relatively low, so the growth substrate may be removed using a mechanical or chemical mechanical polishing process. In an example embodiment, the buffer layer 110 is removed together by way of example, but an example embodiment is not limited thereto. In another example embodiment, at least a portion of the buffer layer 110 may remain.

Next, after the growth substrate 101 is removed, an isolation process for formation of the light emitting cell LC may be performed. The isolation process may be performed by a dry etching or wet etching process with respect to the first surface 130A of the semiconductor stack 130. For example, a dry etching process using a photoresist pattern may be performed on the first surface 130A of the semiconductor stack 130, so dotted line portions ('IS','ISN', and 'ISP' of FIG. 13) are removed. Thus, as illustrated in FIG. 18, a region indicated as M' may remain.

Figure 14:
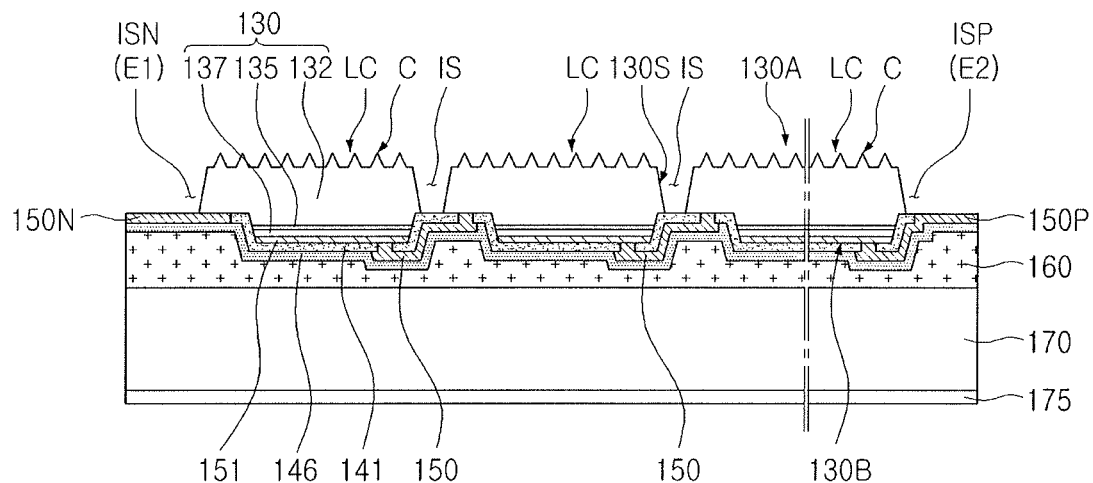

In the isolation process, the dotted line portions are removed from the semiconductor stack 130. Thus, as illustrated in FIG. 14, the semiconductor stack 130 may be completely separated as a plurality of light emitting cells LC. Additionally, with the isolation process for formation of the light emitting cell LC, a surface treatment process for formation of a concave-convex portion C in a surface of the semiconductor stack 130 from which the growth substrate 101 is removed may be performed.

In an etching process for isolation, the insulating layer 141 may serve as an etch stop layer, and thus may protect the connection electrode 150. As a result, a portion of the insulating layer 141 located between the light emitting cells LC may be exposed. In addition, the etching process described above is performed from the first surface 130A of the semiconductor stack 130. Thus, as illustrated in FIG. 14, a side surface 130S of the semiconductor stack 130 may have a surface inclined upward. In other words, the isolation region IS may become narrower from the first surface 130A toward the second surface 130B.

In addition, in the isolation process described above, portions ISN and ISP of a semiconductor stack located at both ends are removed, so a portion of the first pad connection electrode 150N and a portion of the second connection electrode 150P can be exposed on a first end region E1 and a second end region E2, respectively (FIG. 14).

As described above, an additional concave-convex portion forming process may be performed. The concave-convex portion C formed in a process described above may improve light extraction efficiency from the first surface 130A of the semiconductor stack 130, i.e., a surface of the first conductivity type semiconductor layer 132 or the buffer layer 110. The concave-convex portion forming process may be also performed by a dry etching or wet etching process. As needed, the concave-convex portion forming process may be performed prior to the isolation process.

In the transparent support substrate 170, the refractive index matching layer 175 may be additionally formed to improve light extraction efficiency of light emitted in a direction of a substrate. The refractive index matching layer 175 may be formed in a process illustrated in FIG. 14, but an example embodiment is not limited thereto. For example, the refractive index matching layer may be formed in advance in the transparent support substrate 170 before a bonding process (referring to FIG. 12).

FIGS. 19A through 19D are side cross-sectional views of various examples of a buffer layer to be applied to example embodiments, respectively. A semiconductor light emitting device according to an example embodiment may be manufactured using a stress compensation layer in addition to the buffer layer 110 illustrated in FIG. 6.

Figure 19A:
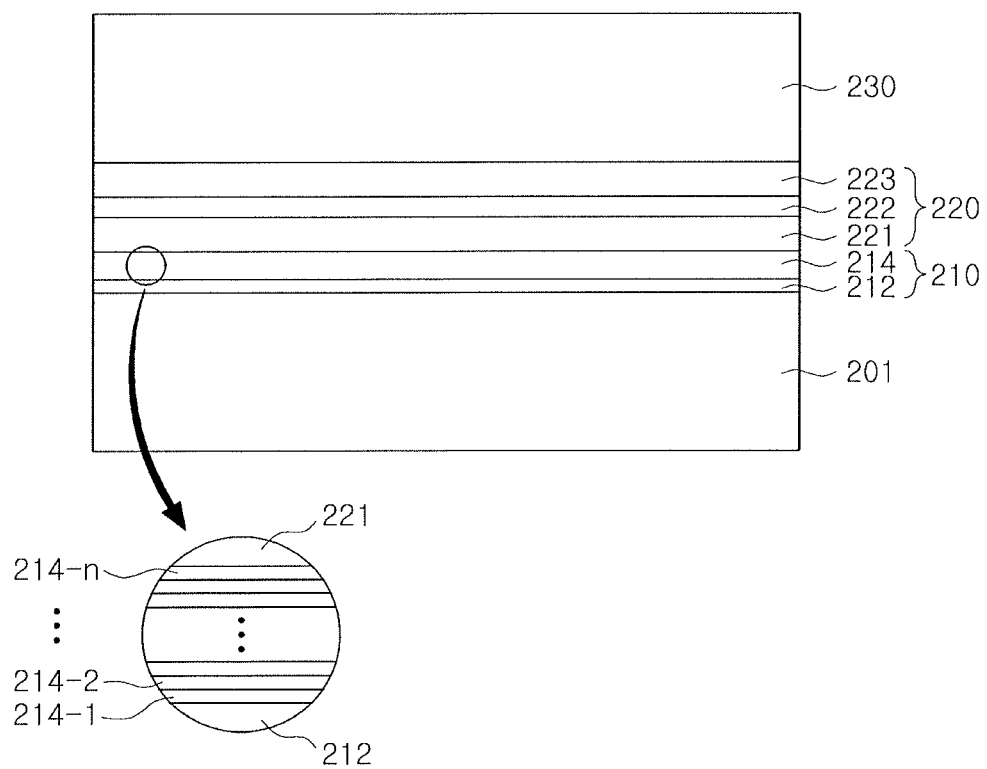
FIGS. 19A through 19D illustrate respective side cross-sectional views of various examples of a composite buffer layer to be applied in an example embodiment.

As illustrated in FIG. 19A, a buffer layer 210, a stress compensation layer 220, and a nitride stack 230 may be sequentially arranged on a silicon substrate 201.

Examples of the silicon substrate 201 may include a substrate partially including a silicon material, as well as a substrate formed only of a silicon material. For example, a silicon-on-insulator (SOI) substrate may also be used as the silicon substrate 201. An upper surface of the silicon substrate 201 may be a (111) plane. The buffer layer 210 may include a nucleation growth layer 212 disposed on the silicon substrate 201 and a lattice buffer layer 214 disposed on the nucleation growth layer 212.

The nucleation growth layer 212 may be an AlN layer. The lattice buffer layer 214 may allow for a reduction in defects by bending a threading dislocation. As a thickness of the lattice buffer layer 214 increases, compressive stress relaxation in a first nitride semiconductor layer 221 to be grown subsequently, may be reduced, and defects may also be reduced. The thickness of the lattice buffer layer 214 may be in a range of several hundred nanometers (nm) to several micrometers (μm).

Although the lattice buffer layer 214 may have a single composition, the lattice buffer layer 214 may be a graded layer of $Al_xIn_yGa_{1-x-y}N$ (0≤x,y≤1, x+y≤1). A graded structure employed in the example embodiment may include a plurality of layers 214-1, 214-2, . . . 214-n, and the plurality of layers 214-1, 214-2, . . . 214-n may have a step-graded structure in which a composition of aluminum (Al) is sequentially reduced. In a specific example, the lattice buffer layer 214, having a graded structure, may be implemented by ternary AlGaN in which an Al composition is controlled. In another example, the lattice buffer layer may have a linearly graded structure rather than a step-graded structure.

In the case of the lattice buffer layer 214, a lattice mismatch between the nucleation growth layer 212 formed of AlN and the first nitride semiconductor layer 221 may be reduced in a stepwise manner. In detail, since the lattice buffer layer 214 may effectively generate compressive stress during crystal growth, tensile stress occurring during cooling may be reduced.

The stress compensation layer 220 may include a first nitride semiconductor layer 221, an intermediate layer 222, and a second nitride semiconductor layer 223 sequentially disposed on the lattice buffer layer 214.

The first nitride semiconductor layer 221 may be a nitride crystal layer having a lattice constant greater than that of the lattice buffer layer 214. The first nitride semiconductor layer 221 may include $Al_xIn_yGa_{1-x-y}N$ (0≤x,y≤1, x+y<1), and may be, e.g., a GaN layer. The first nitride semiconductor layer 221 may receive compressive stress applied thereto at an interface thereof with the lattice buffer layer 214.

The compressive stress may be further alleviated as a thickness of the first nitride semiconductor layer 221 is increased. If the thickness (about 2 μm or more) of the first nitride semiconductor layer 221 is increased, when cooling is performed at room temperature after a growth process is completed, due to a difference in thermal expansion coefficient between the silicon substrate 201 and the first nitride semiconductor layer 221, it may be difficult to control the tensile stress, having been generated, and even cracks may occur. Therefore, the intermediate layer 222 may be disposed on the first nitride semiconductor layer 221 to compensate for tensile stress occurring during cooling. The intermediate layer 222 may be a nitride crystal layer having a lattice constant less than that of the first nitride semiconductor layer 221. For example, the intermediate layer 222 may be an $Al_xGa_{1-x}N$ (0.4<x<1) layer.

The second nitride semiconductor layer 223 may be disposed on the intermediate layer 222. The second nitride semiconductor layer 223 may have compressive stress. The compressive stress of the second nitride semiconductor layer 223 may compensate for relatively low compressive stress or tensile stress received by the first nitride semiconductor layer 221 to thus suppress occurrence of cracks. The second nitride semiconductor layer 223 may include $Al_xIn_yGa_{1-x-y}N$ (0≤x,y≤1, x+y<1) in a manner similar to the first nitride semiconductor layer 221. For example, the second nitride semiconductor layer 223 may be a GaN layer. At least one of the first nitride semiconductor layer 221 and the second nitride semiconductor layer 223 may be an undoped nitride layer, but is not limited thereto. The nitride stack 230 may correspond to the semiconductor stack 130 in the foregoing example embodiment.

Figure 19B:
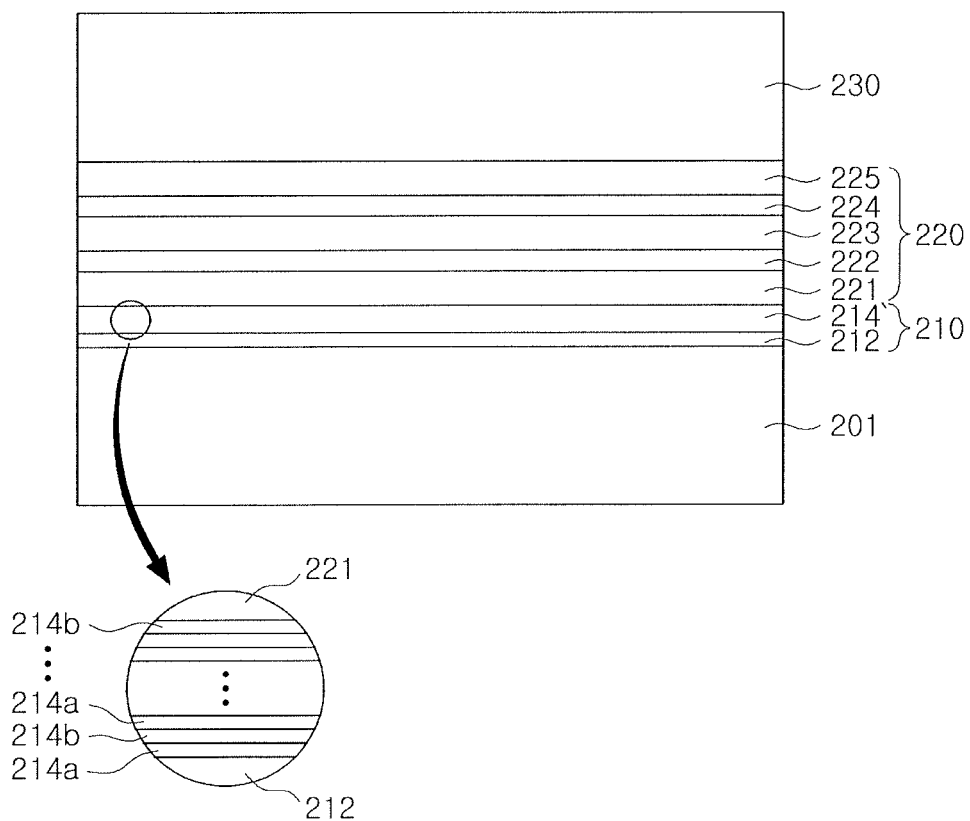

With reference to FIG. 19B, a buffer layer 210, a stress compensation layer 220, and a nitride stack 230 may be sequentially arranged on a silicon substrate 201, in a manner similar to FIG. 19A. Also, components indicated by the same reference numerals as those in FIG. 19A may be referred to the description of FIG. 19A unless otherwise described.

Similar to the buffer layer 210 illustrated in FIG. 19A, the buffer layer 210 may include a nucleation growth layer 212 formed of AlN and a lattice buffer layer 214', while the lattice buffer layer 214' employed in an example embodiment may have a different structure from that of the lattice buffer layer 214 illustrated in FIG. 19A.

The lattice buffer layer 214' may have a superlattice structure in which two or more layers 214a and 214b having different compositions are alternately stacked. For example, the lattice buffer layer 214' may be a superlattice layer of $Al_{x1}In_{y1}Ga_{1-x1-y1}N/Al_{x2}In_{y2}Ga_{1-x2-y2}N$ (0≤x1,x2,y1,y2≤1, x1≠x2 or y1≠y2, x1+y1≤1, x2+y2≤1). As in the example embodiment, the lattice buffer layer 214' employing the superlattice structure therein may also effectively alleviate stress between the silicon substrate 201 and the first nitride semiconductor layer 221.

The stress compensation layer 220 employed in an example embodiment may further include a second intermediate layer 224 and a third nitride semiconductor layer 225, in addition to the first nitride semiconductor layer 221 and the second nitride semiconductor layer 223, and a first intermediate layer 222 disposed therebetween, as described above with reference to FIG. 19A.

The second intermediate layer 224 and the third nitride semiconductor layer 225 may be understood as layers having functions similar to those of the first the intermediate layer 222 and the second nitride semiconductor layer 223. For example, the second intermediate layer 224 may be disposed on the second nitride semiconductor layer 223 to compensate for tensile stress generated during cooling. The second intermediate layer 224 may be formed of a nitride crystal having a lattice constant lower than that of the second nitride semiconductor layer 223. For example, the second intermediate layer 224 may be an $Al_xGa_{1-x}N$ (0.4<x<1) layer, similarly to the first intermediate layer 222.

The third nitride semiconductor layer 225 may be disposed on the second intermediate layer 224. The third nitride semiconductor layer 225 may have compressive stress, and the compressive stress of the third nitride semiconductor layer 225 may compensate for relatively low compressive stress or tensile stress received by the first nitride semiconductor layer 221 and the second nitride semiconductor layer 223, particularly, the second nitride semiconductor layer 223, thereby suppressing the occurrence of cracks.

The third nitride semiconductor layer 225 may include $Al_xIn_yGa_{1-x-y}N$ (0≤x,y≤1, x+y<1), similarly to the second nitride semiconductor layer 223. For example, the third nitride semiconductor layer 225 may be a GaN layer.

Figure 19C:
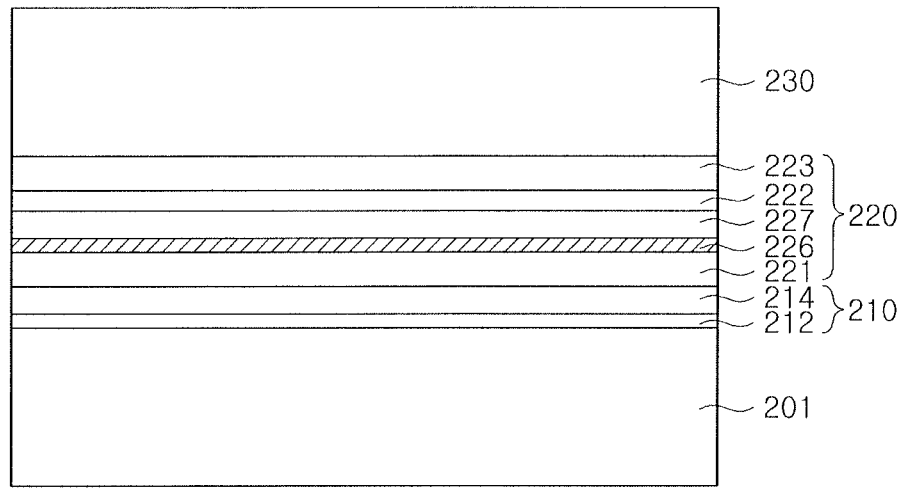

With reference to FIG. 19C, a buffer layer 210, a stress compensation layer 220, and a nitride stack 230 may be sequentially arranged on a silicon substrate 201, similar to FIG. 19A, while a mask layer 226 and a coalesced nitride layer 227 formed on the mask layer 226 may be provided, differently from the illustration in FIG. 19A. The mask layer 226 may be disposed on a first nitride semiconductor layer 221.

Most of threading dislocations from the first nitride semiconductor layer 221 may be blocked by the mask layer 226, and remaining threading dislocations may also be bent by the coalesced nitride layer 227 to be subsequently grown. As a result, a defect density of a nitride crystal to be subsequently grown may be significantly improved. A thickness and defect density of the coalesced nitride layer 227 may be changed, depending on variables such as growth conditions, for example, temperature, pressure, and a molar composition ratio of a group V/III source.

The mask layer 226 may be formed of silicon nitride ($SiN_x$) or titanium nitride (TiN). For example, silane ($SiH_4$) and ammonia gas are used to form the mask layer 226 formed of SiNx. The mask layer 226 may not entirely cover a surface of the first nitride semiconductor layer 221. Thus, an exposed region of the mask layer 226 may be determined according to an extent to which the mask layer 226 covers the first nitride semiconductor layer 221, and thus, an initial island growth pattern of a nitride crystal which grows thereon may be changed. For example, when an exposed area of the nitride semiconductor layer is reduced by increasing a mask area of $SiN_x$, a density of the initial island of the coalesced nitride layer 227 to be grown on the mask layer 226 may decrease, while a size of an island to be coalesced may be relatively increased. Thus, a thickness of the coalesced nitride layer 227 may be also increased.

When the mask layer 226 is added, due to the mask layer, stress between nitride semiconductor layers is decoupled, so compressive stress transmitted to the coalesced nitride layer 227 may be partially blocked. In addition, in the coalesced nitride layer 227, while islands which are growing are coalesced, relative tensile stress may be generated. As a result, while the first nitride semiconductor layer 221 is subjected to strong compressive stress by the buffer layer 210, the coalesced nitride layer 227 on the mask layer 226 is subjected to relatively weak compressive stress or tensile stress by stress decoupling and island coalescence. When a thickness of a layer having relatively low compressive stress exceeds a critical point, a crack is generated in a thin film during cooling. Thus, a thickness of the coalesced nitride layer 227 may be selected under conditions in which defect density is reduced while a crack is not generated.

Figure 19D:
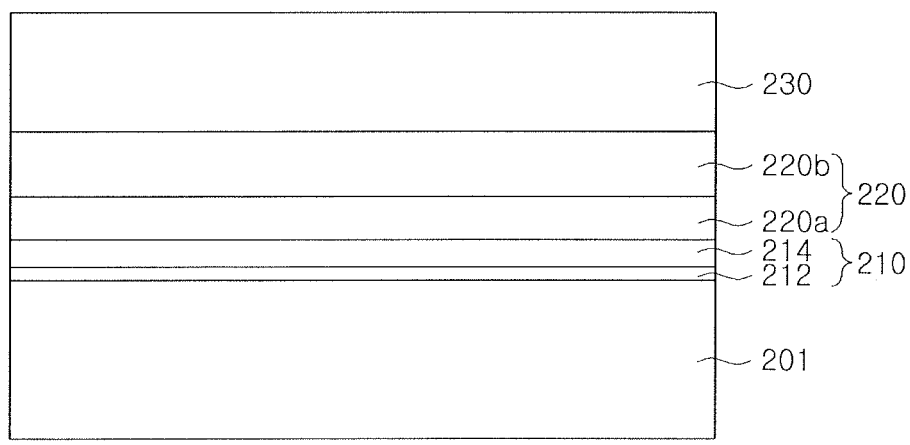

With reference to FIG. 19D, a buffer layer 210, a stress compensation layer 220, and a nitride stack 230 sequentially disposed on a silicon substrate 201 are illustrated.

The stress compensation layer 220, applied to an example embodiment, may include a first nitride semiconductor layer 220a and a second nitride semiconductor layer 220b, formed under different growth conditions. The first nitride semiconductor layer 220a grows in a two-dimensional mode so that a rate of increase in surface roughness is controlled. Thus, occurrence of a twist grain boundary at an interface with the second nitride semiconductor layer 220b may be reduced.

The first nitride semiconductor layer 220a may be formed under a first growth condition to have surface roughness in which a roughness ratio with respect to surface roughness of the buffer layer 210 is less than 3, and the second nitride semiconductor layer 220b may be formed under a second growth condition on the first nitride semiconductor layer 220a. Here, in the second growth condition, in order to increase a three-dimensional growth mode in comparison with the first growth condition, at least one of temperature, pressure, and a molar ratio of group V/III may be different from the first growth condition. The first nitride semiconductor layer 220a may have a thickness in a range of 2 nm to 1000 nm. As a thickness of the first nitride semiconductor layer 220a increases, occurrence of a twist grain boundary at an interface of the first nitride semiconductor layer 220a and the second nitride semiconductor layer 220b may be reduced. However, when a thickness of the first nitride semiconductor layer 220a is great, crystallinity of an overall thin film may be decreased. In this regard, because the first nitride semiconductor layer grows at a relatively low temperature in comparison with a nitride layer, a defect may increase. Thus, while a thickness of the first nitride semiconductor layer 220a is thin, occurrence of a twist grain boundary may be reduced.

When a twist grain boundary is reduced, a defect of the second nitride semiconductor layer 220b stacked on the first nitride semiconductor layer 220a may be reduced. In other words, while the first nitride semiconductor layer 220a has a thickness in a rage of 2 nm to 1000 nm, the first nitride semiconductor layer has roughness in a range of 3 or less as a ratio to roughness of a buffer layer. Thus, a defect of the second nitride semiconductor layer 220b stacked thereabove may be reduced. Thus, equivalent crystallinity is obtained at a low thickness, so an overall structure may be thinned. For example, even when a mask layer is not used, an overall thickness of the buffer layer 210 and the stress compensation layer 220 may be 6 μm or less. Thus, the process time and costs of a crystal growing operation may be reduced.

The second nitride semiconductor layer 220b may be formed as $Al_xIn_yGa_{1-x-y}N(0≤x,y≤1, x+y<1)$. The second nitride semiconductor layer 220b may grow continuously on the first nitride semiconductor layer 220a without additional growth of a different composition. The second nitride semiconductor layer 220b may be the same composition as the first nitride semiconductor layer 220a. For example, the first nitride semiconductor layer 220a and the second nitride semiconductor layer 220b may be GaN. In a specific example, the first nitride semiconductor layer 220a may be an undoped GaN, and the second nitride semiconductor layer 220b may be an n-type GaN.

A semiconductor light emitting device according to example embodiments described above has a structure capable of emitting light from both surfaces or from an entire surface, and may be advantageously used as various LED modules and lighting devices.

Figure 20:
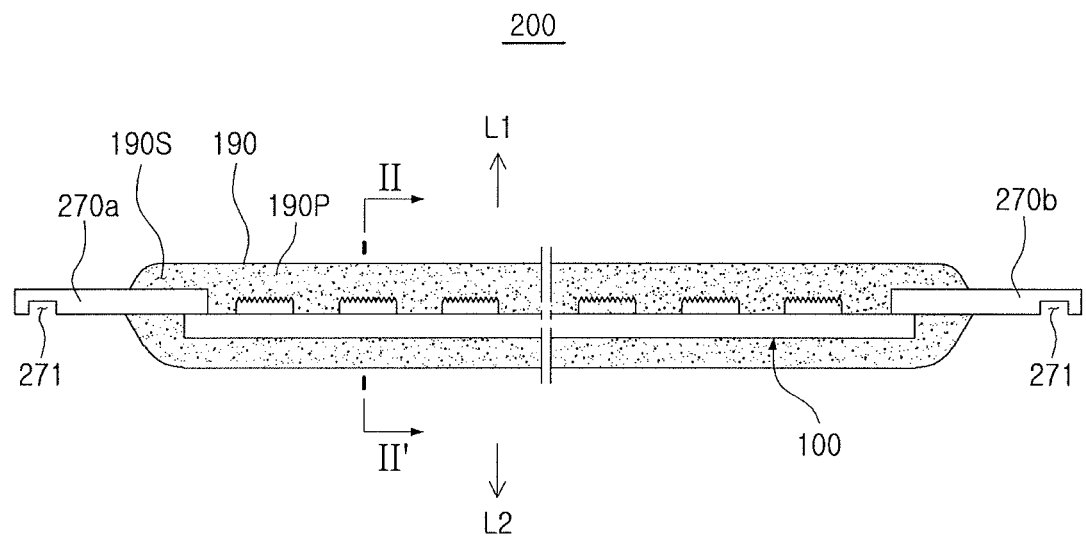
FIG. 20 illustrates a side cross-sectional view of a LED module according to an example embodiment.
Figure 21:
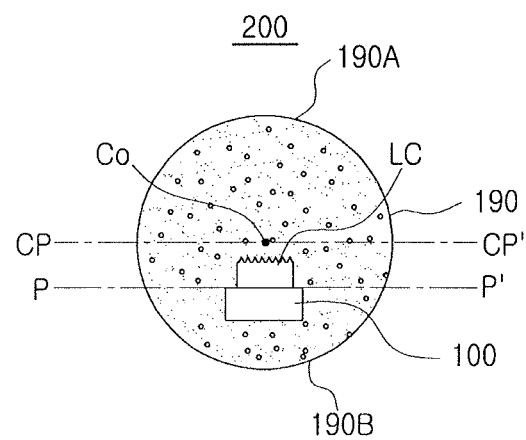
FIG. 21 illustrates a front cross-sectional view of the LED module in FIG. 20.

FIG. 20 is a side cross-sectional view illustrating a LED module according to an example embodiment, and FIG. 21 is a front cross-sectional view illustrating the LED module in FIG. 20.

With reference to FIGS. 20 and 21, a LED module 200 may include the semiconductor light emitting device 100 illustrated in FIGS. 1 through 3, a wavelength conversion portion 190 surrounding the semiconductor light emitting device 100, and a first connection terminal 270a and a second connection terminal 270b connected to the semiconductor light emitting device 100 and provide for applying power. Each of the first connection terminal 270a and the second connection terminal 270b may have a stop groove 271 for fixation to a separate external device (for example, 400 in FIG. 24).

The wavelength conversion portion 190 may be formed to cover not only an upper surface in which the plurality of light emitting cells LC are located but also a lower surface of the semiconductor light emitting device 100. In detail, with reference to FIGS. 20 and 21, the wavelength conversion portion 190 may be formed to surround the transparent support substrate 170 while covering the plurality of light emitting cells LC located in an upper surface of the transparent support substrate 170. Thus, light emitted in both directions, i.e., the upper direction L1 and the lower direction L2, may be converted to desired light by the wavelength conversion portion 190.

In FIG. 20, a side cross section of the LED module 200 is illustrated, and the wavelength conversion portion 190 is illustrated as being located in an upper portion and a lower portion of the semiconductor light emitting device. However, as illustrated in FIG. 21, the wavelength conversion portion 190 may be provided to surround a side surface of the semiconductor light emitting device 100.

With reference to FIG. 21, a mounting surface P-P', a reference plane, from which an upper surface of the semiconductor light emitting device 100 is extended is disposed to be lower than a surface CP-CP' passing through a center C0 of the wavelength conversion portion 190, so a surface area of a front portion 190A of the wavelength conversion portion 190 may be disposed to be wider than a surface area of a rear portion 190B. Using this arrangement, an amount of light emitted to an upper surface and a lower surface may be adjusted.

The wavelength conversion portion 190 may include a wavelength conversion material 190P such as a phosphor or a quantum dot and a transparent resin 190S containing the same. For example, the wavelength conversion material 190P may convert a portion of light generated by the active layer 135 to light of a converted wavelength. The wavelength conversion material 190P may be configured to obtain white light as final emission light. In an example, the wavelength conversion material 190P may include two or more wavelength conversion materials. For example, the wavelength conversion material may include at least one of a green phosphor, a yellow phosphor, and a red phosphor.

Figure 22:
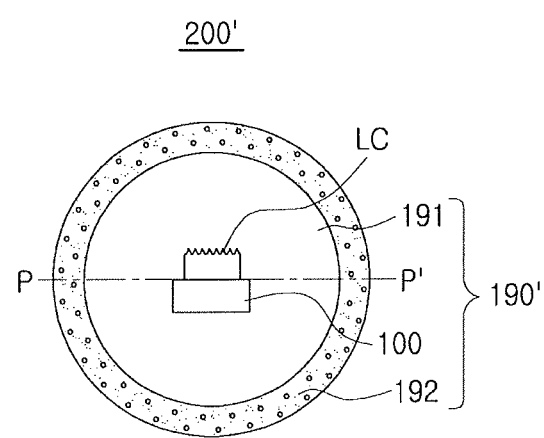
FIG. 22 illustrates a front cross-sectional view of a LED module according to an example embodiment.

FIG. 22 illustrates a LED module having a wavelength conversion portion with a structure different from the example embodiment described above.

With reference to FIG. 22, a LED module 200' according to an example embodiment may include a semiconductor light emitting device 100 according to an example embodiment described above, and a wavelength conversion portion 190' surrounding the same. The wavelength conversion portion 190' according to an example embodiment may include a transparent resin layer 191 surrounding the semiconductor light emitting device 100, and a wavelength conversion layer 192 surrounding the transparent resin layer 191. The wavelength conversion layer 192 may be configured in a manner similar to the wavelength conversion portion 190 illustrated in FIG. 21.

Compared with a previous example embodiment (referring to FIG. 22), the wavelength conversion layer 192 formed on the transparent resin layer 191 may be provided to have a more uniform thickness, so uniform wavelength conversion may be performed in all directions. In addition, in an example embodiment, the semiconductor light emitting device 100 is placed on a mounting surface P-P', a reference plane, as much as possible, so a distance to the wavelength conversion layer 192 may be maintained to be relatively constant in all directions.

Figure 23:
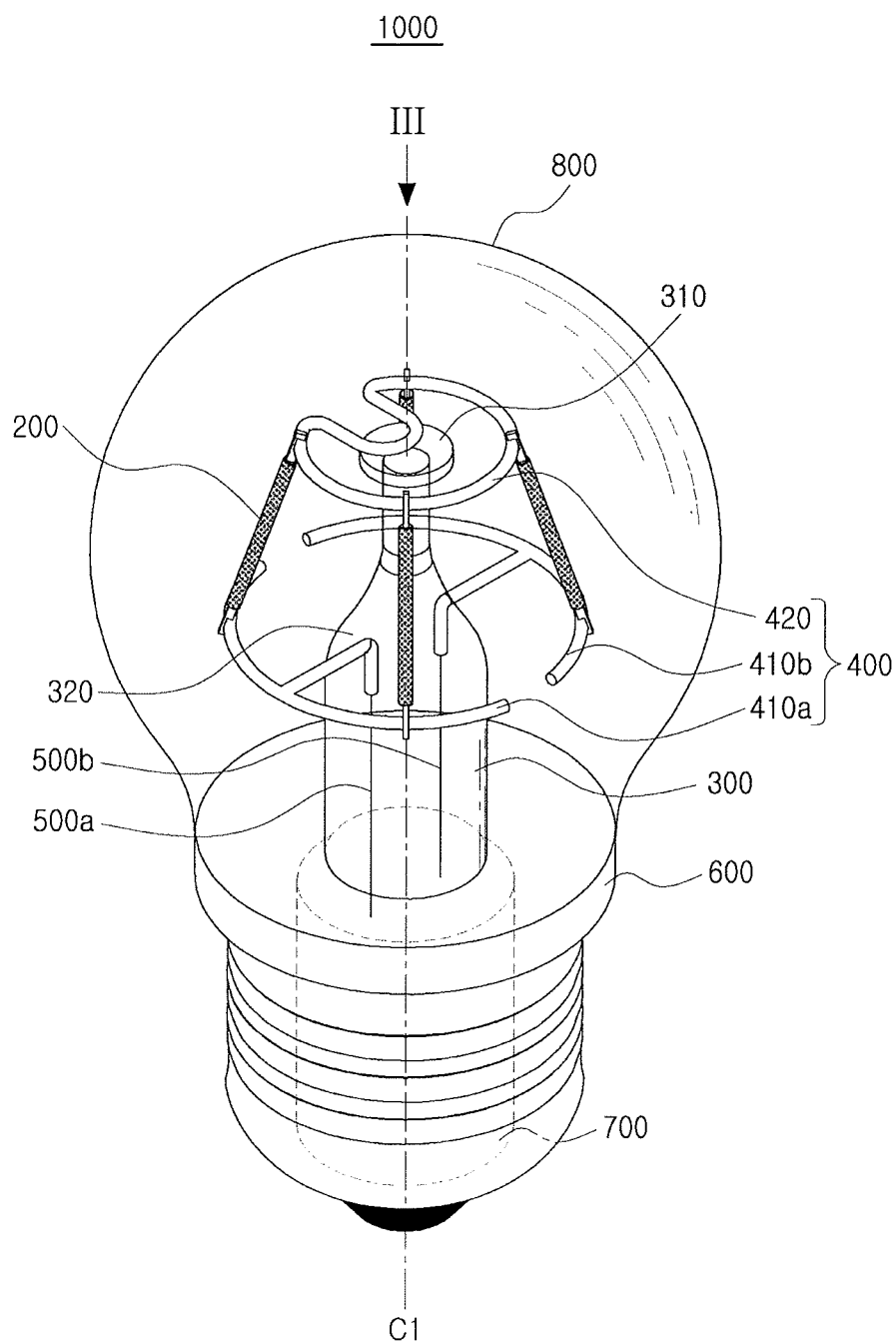
FIG. 23 illustrates a perspective view of a LED lamp according to an example embodiment.
Figure 24:
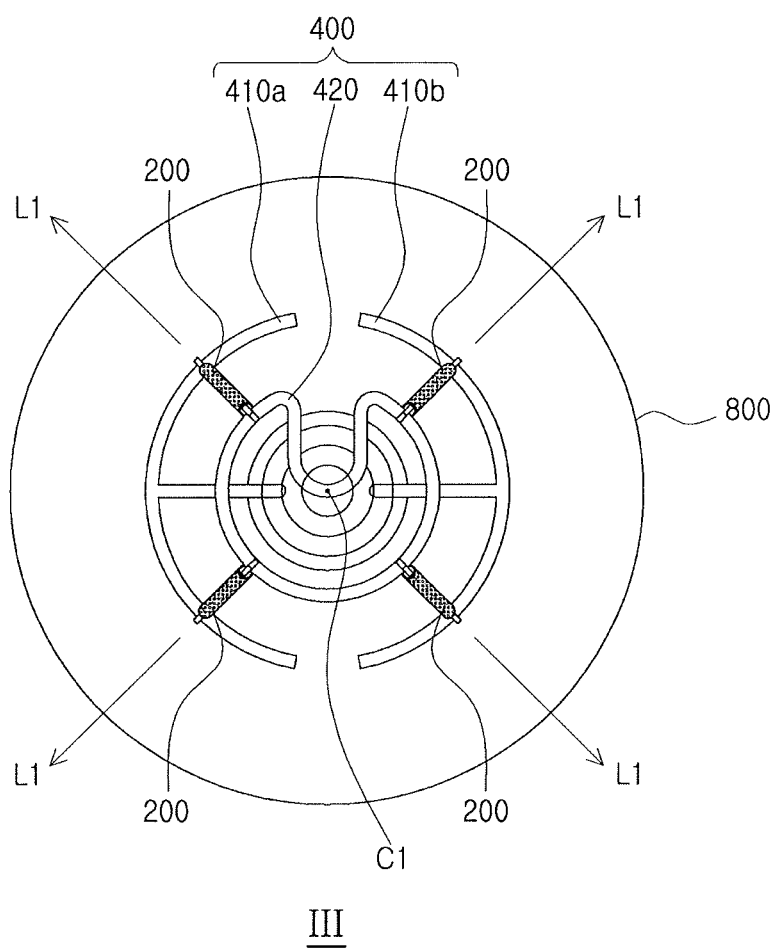
FIG. 24 illustrates a top plan view of the LED lamp in FIG. 23.

FIG. 23 is a perspective view illustrating a LED lamp according to an example embodiment, and FIG. 24 is a top plan view illustrating the LED lamp illustrated in FIG. 23. FIG. 24 is a view seen from direction III of FIG. 23.

With reference to FIGS. 23 and 24, a LED lamp 1000 according to an example embodiment may include a lamp cover 800, a socket 600 combined with one end of the lamp cover 800, and a plurality of LED modules 200 (for example, four LED modules) mounted on an internal space of the lamp cover 800.

When a connection frame 420 and a first electrode frame 410a or a second electrode frame 410b are engaged with and fixed to each other, a main emission surface (in other words, an upper surface) of the LED module 200 may be naturally disposed in a direction of the lamp cover 800, and an opposite surface 110b may be disposed toward a central portion C1.

The lamp cover 800 may be a bulb cover, formed of, e.g., glass, hard glass, quartz glass, or a light-transmitting resin, and which is, e.g., transparent, milky, matte, or colored. The lamp cover 800 may be one of various types. For example, the lamp cover may be one of a bulb-type cove, e.g., A-type, G-type, R-type, PAR-type, T-type, S-type, candle-type, P-type, PS-type, BR-type, ER-type, BRL-type.

The socket 600 is combined with the lamp cover 800 to form an outer shape of the LED lamp 1000, and may be a socket, e.g., E40, E27, E26, E14, GU, B22, BX, BA, EP, EX, GY, GX, GR, GZ, G-type, or the like, to be replaced with any suitable lighting device. Electric power applied to the LED lamp 1000 may be applied through the socket 600. A power supply portion 700 is disposed in an internal space of the socket 600 to AC-DC convert electric power, applied through the socket 600, or to change a voltage, which may be provided for the LED module 200.

One end of a support 300 is installed to be fixed to a central portion C1 of the socket 600, and a frame 400 for fixing the LED module 200 may be disposed in the support 300. While the support 300 covers an open region of the lamp cover 800, welding is performed through a high temperature heat treatment. Thus, a sealed internal space may be formed, so the LED module 200 disposed in the internal space of the lamp cover 800 may be protected from external moisture, or the like.

The frame 400 may be formed of a metallic material to supply electric power while the LED module 200 is fixed, and may include a connection frame 420 for connecting a plurality of LED modules 200, and a first electrode frame 410a and a second electrode frame 410b for supplying electric power. In the other end of the support 300, a seat portion 310 for fixing the connection frame 420 may be formed. In a middle of the support 300, a first electrode frame 410a and a second electrode frame 410b are installed to be fixed, and thus may support the plurality of LED modules 200 welded in the first electrode frame 410a and the second electrode frame 410b. The first electrode frame 410a and the second electrode frame 410b are connected to a first electric wire 500a and a second electric wire 500b, embedded in the support 300, respectively, and electric power supplied from the power supply portion 700 may be applied thereto.

The LED module 200 may be provided as a plurality of LED modules, and the plurality of LED modules may be accommodated in an internal space of the lamp cover 800. The LED module 200 is manufactured to have a shape similar to that of a filament of an incandescent lamp according to the related art. Moreover, when power is applied, in a manner similar to a filament, linear light is emitted therefrom, so the LED module may be referred to as an LED filament.

With reference to FIG. 24, when the LED module 200 is viewed from an upper portion (in direction III) of the LED lamp 1000, the LED module 200 may be arranged in a rotationally symmetrical manner based on a central portion C1 of the socket 600. In detail, in an internal space of the lamp cover 800, in order to allow light in a first direction L1, which is a main light emission direction of each LED module 200, to be directed to the lamp cover 800, the LED module may be rotationally symmetrically disposed around the support 300. In this arrangement, forward light of the LED module 200 is directly emitted through the lamp cover 800, and rearward light of the LED module 200 also contributes to total light output.

The LED module 200 applied to an example embodiment may have not only a shape in which light emitting cells are connected in series as an example illustrated in FIGS. 1 and 2, but also may have a shape in which light emitting cells are connected in parallel or serially in parallel (for example, referring to FIG. 5A).

Figure 25A:
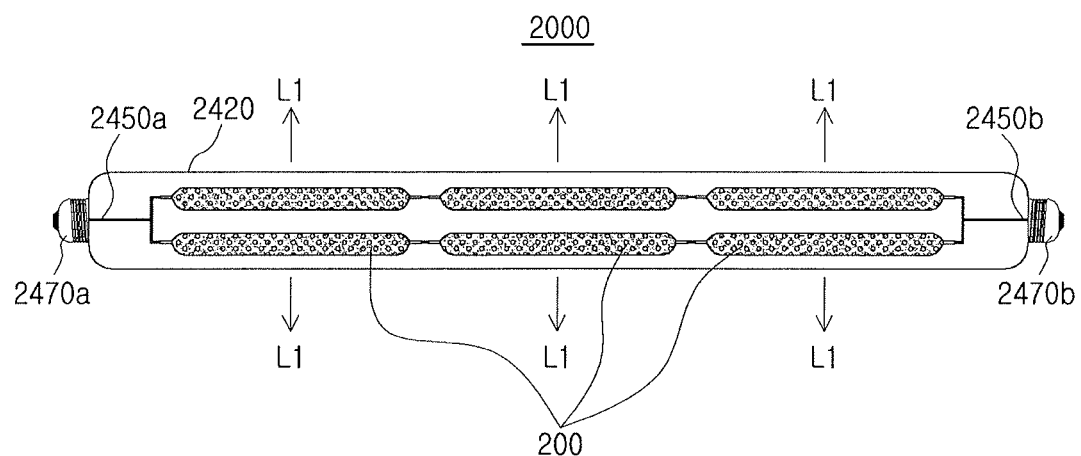
FIGS. 25A and 25B illustrate perspective views of a LED lamp according to various example embodiments.
Figure 25B:
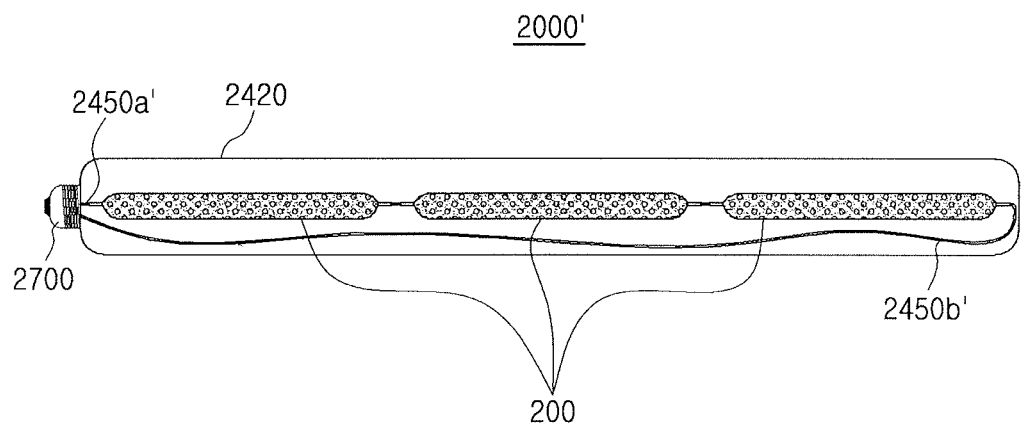

FIGS. 25A and 25B are perspective views illustrating a LED lamp according to various example embodiments.

With reference to FIG. 25A, an LED lamp 2000 according to an example embodiment may include a lamp cover 2420 having a bar shape elongated in one direction, a plurality of LED modules 200 disposed in the lamp cover 2420, and a pair of sockets 2470a and 2470b disposed in both ends of the lamp cover 2420.

In an example embodiment, the plurality of LED modules 200 are illustrated as four LED modules. The four LED modules 200 are arranged in series in pairs, and two rows are arranged in parallel. The LED modules 200, arranged in two rows and connected in parallel, may be disposed in order to allow light, from two surfaces opposing each other, to be directed in a first direction L1, a main light emission direction. A first wiring 2450a and a second wiring 2450b connected to both ends of the four LED modules 200 may be connected to the pair of sockets 2470a and 2470b, respectively.

With reference to FIG. 25B, an LED lamp 2000' according to an example embodiment may include a lamp cover 2420 in a manner similar to a previous example embodiment, but may include a single socket 2700. In addition, the LED lamp 2000' according to an example embodiment may include three LED modules 200, connected in series.

The socket 2700 applied to an example embodiment is a different standard to lamps in a previous example embodiment, and includes connection terminals having two polarities. In addition, the two connection terminals may be configured to be connected to a first wiring 2450a' and a second wiring 2450b', respectively.

As set forth above, according to example embodiments, a semiconductor light emitting device having a multi-cell structure in which light is emitted from both surfaces or an entire surface, e.g., continuously surrounding the multi-cell structure, may be provided. The semiconductor light emitting device may stably implement a wiring structure between the multi-cells, i.e., a connection electrode of a LED cell, as a module of various lighting devices, e.g., a filament type LED lamp.

That is, according to example embodiments, after an insulating layer is formed on a mesa etched surface, a metal wiring is formed, followed by a complete isolation process, i.e., formation of a plurality of LED cells separated from each other, where an epitaxial layer is separated from a surface opposite to a mesa etched surface. In the isolation process, the metal wiring may be protected by the insulating layer, and the metal wiring may not be located in an isolated side surface. Such a metal wiring may connect the plurality of LED cells in series, in parallel, and serially in parallel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a plurality of light emitting cells, each light emitting cell of the plurality of light emitting cells including a first conductivity type semiconductor layer, a second conductivity type semiconductor layer, and an active layer between the first and second conductivity type semiconductor layers;
an insulating layer on the plurality of light emitting cells, the insulating layer having a first opening and a second opening defining a first contact region of the first conductivity type semiconductor layer and a second contact region of the second conductivity type semiconductor layer, respectively, in each of the plurality of light emitting cells;
a connection electrode on the insulating layer and connecting the first contact region and the second contact region to electrically connect the plurality of light emitting cells to each other;
a transparent support substrate having a first surface facing the insulating layer and the connection electrode and a second surface opposite the first surface;
a transparent bonding layer between the insulating layer and the transparent support substrate and bonding the insulating layer to the first surface of the transparent support substrate; and
a wavelength conversion portion surrounding the transparent support substrate to cover the plurality of light emitting cells and the second surface of the transparent support substrate.

2. The semiconductor light emitting device as claimed in claim 1, wherein the plurality of light emitting cells are arranged to be spaced apart from each other by an isolation region, the insulating layer including a first portion on a bottom of the isolation region.

3. The semiconductor light emitting device as claimed in claim 2, wherein the first contact region of the first conductivity type semiconductor layer is in a region of the plurality of light emitting cells, from which portions of the second conductivity type semiconductor layer and the active layer have been removed.

4. The semiconductor light emitting device as claimed in claim 2, wherein a width of the isolation region decreases as a distance from the insulating layer decreases.

5. The semiconductor light emitting device as claimed in claim 1, further comprising a passivation film on the insulating layer to cover the connection electrode, the passivation film being conformal on a combined structure of the insulating layer and the connection electrode.

6. The semiconductor light emitting device as claimed in claim 1, wherein the plurality of light emitting cells have a concave-convex portion, the concave-convex portion and the insulating layer being on opposite surfaces of the first conductivity type semiconductor layer.

7. The semiconductor light emitting device as claimed in claim 1, further comprising a refractive index matching layer on an upper surface of the transparent support substrate, the refractive index matching layer having a refractive index lower than a refractive index of the transparent support substrate.

8. The semiconductor light emitting device as claimed in claim 1, wherein the transparent bonding layer includes at least one of a silicone resin, an epoxy resin, a polyacrylate, a polyimide, a polyamide, and a benzocyclobutene (BCB).

9. The semiconductor light emitting device as claimed in claim 1, wherein the transparent bonding layer includes a spin-on-glass.

10. The semiconductor light emitting device as claimed in claim 1, wherein the transparent support substrate is a glass substrate or a sapphire substrate.

11. A semiconductor light emitting device, comprising:
a semiconductor stack having a first surface and a second surface opposite each other, the semiconductor stack including a first conductivity type semiconductor layer, a second conductivity type semiconductor layer, and an active layer between the first and second conductivity type semiconductor layers, and the first surface and the second surface of the semiconductor stack being surfaces of the first conductivity type semiconductor layer and the second conductivity type semiconductor layer, respectively;
an isolation region dividing the semiconductor stack into a plurality of light emitting cells;
an insulating layer on the plurality of light emitting cells, the insulating layer having a first opening and a second opening defining a first contact region of the first conductivity type semiconductor layer and a second contact region of the second conductivity type semiconductor layer, respectively, in each of the plurality of light emitting cells;
a connection electrode on the insulating layer and connecting the first contact region and the second contact region to electrically connect the plurality of light emitting cells to each other;
a transparent bonding layer to cover the second surface of the semiconductor stack in which the insulating layer and the connection electrode are disposed; and
a transparent support substrate having a first surface bonded to the second surface of the semiconductor stack by the transparent bonding layer and a second surface opposite to the first surface,
wherein the insulating layer includes:
a first portion under each light emitting cell of the plurality of light emitting cells, the first portion being completely overlapped by a corresponding light emitting cell of the plurality of light emitting cells, and
a second portion exposed between every two adjacent light emitting cells of the plurality of light emitting cells, the first and second portions being separated from each other by respective ones of the first and second openings, and each of the first and second portions including a flat portion parallel to a bottom of a corresponding light emitting cell and a slanted portion inclined away from the corresponding light emitting cell.

12. The semiconductor light emitting device as claimed in claim 11, wherein the first contact region of the first conductivity type semiconductor layer is adjacent the second surface of the semiconductor stack.

13. The semiconductor light emitting device as claimed in claim 12, wherein a first portion of the insulating layer is in the isolation region, the first portion of the insulating layer being on substantially a same level as the first contact region.

14. The semiconductor light emitting device as claimed in claim 11, wherein the first surface of the transparent support substrate has a first region, in which the semiconductor stack is disposed, and a second region, in which the semiconductor stack is not disposed.

15. The semiconductor light emitting device as claimed in claim 14, wherein the connection electrode has a pad portion extended onto the second region of the transparent support substrate.

16. The semiconductor light emitting device as claimed in claim 15, wherein the pad portion of the connection electrode is on a substantially same level as a portion of the insulating layer, located in the isolation region.

17. The semiconductor light emitting device as claimed in claim 11, further comprising a wavelength conversion portion surrounding the transparent support substrate to cover the plurality of light emitting cells.

18. A semiconductor light emitting device, comprising:
   a transparent support substrate having a first surface and a second surface opposite each other, and the first surface having a first end region and a second end region, and a light-emitting region between the first end region and the second end region;
   a plurality of light emitting cells spaced apart from each other on the light-emitting region, each light emitting cell of the plurality of light emitting cells including a first conductivity type semiconductor layer, a second conductivity type semiconductor layer, and an active layer between the first and second conductivity type semiconductor layers, the second conductivity type semiconductor layer facing the transparent support substrate;
   an insulating layer between the plurality of light emitting cells and the first surface of the transparent support substrate, the insulating layer having a first opening and a second opening defining a first contact region of the first conductivity type semiconductor layer and a second contact region of the second conductivity type semiconductor layer, respectively, in each light emitting cell;
   a connection electrode along the insulating layer and connecting a first contact region and a second contact region of different light emitting cells adjacent to each other, and having a first pad portion and a second pad portion extended to the first end region and the second end region of the transparent support substrate, respectively;
   a transparent bonding layer between the transparent support substrate and the plurality of light emitting cells and bonding the insulating layer to the first surface of the transparent support substrate; and
   a wavelength conversion portion surrounding the transparent support substrate to cover the plurality of light emitting cells and the second surface of the transparent support substrate.

19. The semiconductor light emitting device as claimed in claim 18, wherein the connection electrode connects the plurality of light emitting cells in series.

20. The semiconductor light emitting device as claimed in claim 18, wherein a bottom surface of a spacing region, by which the plurality of light emitting cells are spaced apart from each other, is provided by the insulating layer, and is located on substantially the same level as the first pad portion and the second pad portion.

* * * * *